(12) United States Patent
Lin et al.

(10) Patent No.: US 12,080,775 B2
(45) Date of Patent: Sep. 3, 2024

(54) SEMICONDUCTOR DEVICE AND FORMING METHOD THEREOF

(71) Applicant: TAIWAN SEMICONDUCTOR MANUFACTURING COMPANY, LTD., Hsinchu (TW)

(72) Inventors: Wen-Kai Lin, Yilan County (TW); Shih-Chiang Chen, Taichung (TW); Po-Shao Lin, Taipei (TW); Wei-Yang Lee, Taipei (TW); Chia-Pin Lin, Hsinchu County (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 439 days.

(21) Appl. No.: 17/461,312

(22) Filed: Aug. 30, 2021

(65) Prior Publication Data
US 2023/0062597 A1   Mar. 2, 2023

(51) Int. Cl.
*H01L 29/76* (2006.01)
*H01L 29/06* (2006.01)
(Continued)

(52) U.S. Cl.
CPC .... *H01L 29/42392* (2013.01); *H01L 29/0665* (2013.01); *H01L 29/66545* (2013.01);
(Continued)

(58) Field of Classification Search
CPC ........... H01L 29/42392; H01L 29/0665; H01L 29/6656; H01L 29/66742; H01L 29/78696; H01L 29/0673; H01L 21/823821; H01L 29/785; H01L 29/66795; H01L 29/42356; H01L 21/02603; H01L 27/088; H01L 21/823857; H01L 27/0886; H01L 21/02532; H01L 21/30604; H01L 21/823462; H01L 23/481; H01L 27/0922;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

EP   3127862 A1 *  2/2017   ............. B82Y 10/00

*Primary Examiner* — Niki H Nguyen
(74) *Attorney, Agent, or Firm* — Maschoff Brennan

(57) ABSTRACT

A semiconductor device includes a plurality of nanostructures extending in a first direction above a semiconductor substrate and arranged in a second direction substantially perpendicular to the first direction and a gate structure extending in a third direction perpendicular to both the first and second directions, the gate structure surrounding each of the plurality of nano structures. Each of the plurality of nanostructures has an outer region having a composition different from a composition of an inner region of each of the plurality of the nanostructures. The gate structure includes a plurality of high-k gate dielectric layers respectively surrounding the plurality of nanostructures, a work function layer surrounding each of the plurality of high-k gate dielectric layers and a fill metal layer surrounding the work function layer.

20 Claims, 39 Drawing Sheets

(51) Int. Cl.
*H01L 29/423* (2006.01)
*H01L 29/66* (2006.01)
*H01L 29/786* (2006.01)

(52) U.S. Cl.
CPC .... *H01L 29/6656* (2013.01); *H01L 29/66742* (2013.01); *H01L 29/78696* (2013.01)

(58) Field of Classification Search
CPC ............... H01L 29/165; H01L 29/4983; H01L 29/66772; H01L 29/78654; H01L 31/035209; H01L 21/02164; H01L 21/0228; H01L 21/02326; H01L 21/02422; H01L 21/02565; H01L 21/02636; H01L 21/28167; H01L 21/28518; H01L 21/28556; H01L 21/31; H01L 21/32133; H01L 21/76829; H01L 21/76831; H01L 21/76841; H01L 21/8221; H01L 21/823475; H01L 21/823892; H01L 23/49838; H01L 23/53252; H01L 23/5386; H01L 27/124; H01L 29/045; H01L 29/068; H01L 21/02252

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0190829 A1* | 7/2018 | Song ................ H01L 29/42392 |

* cited by examiner

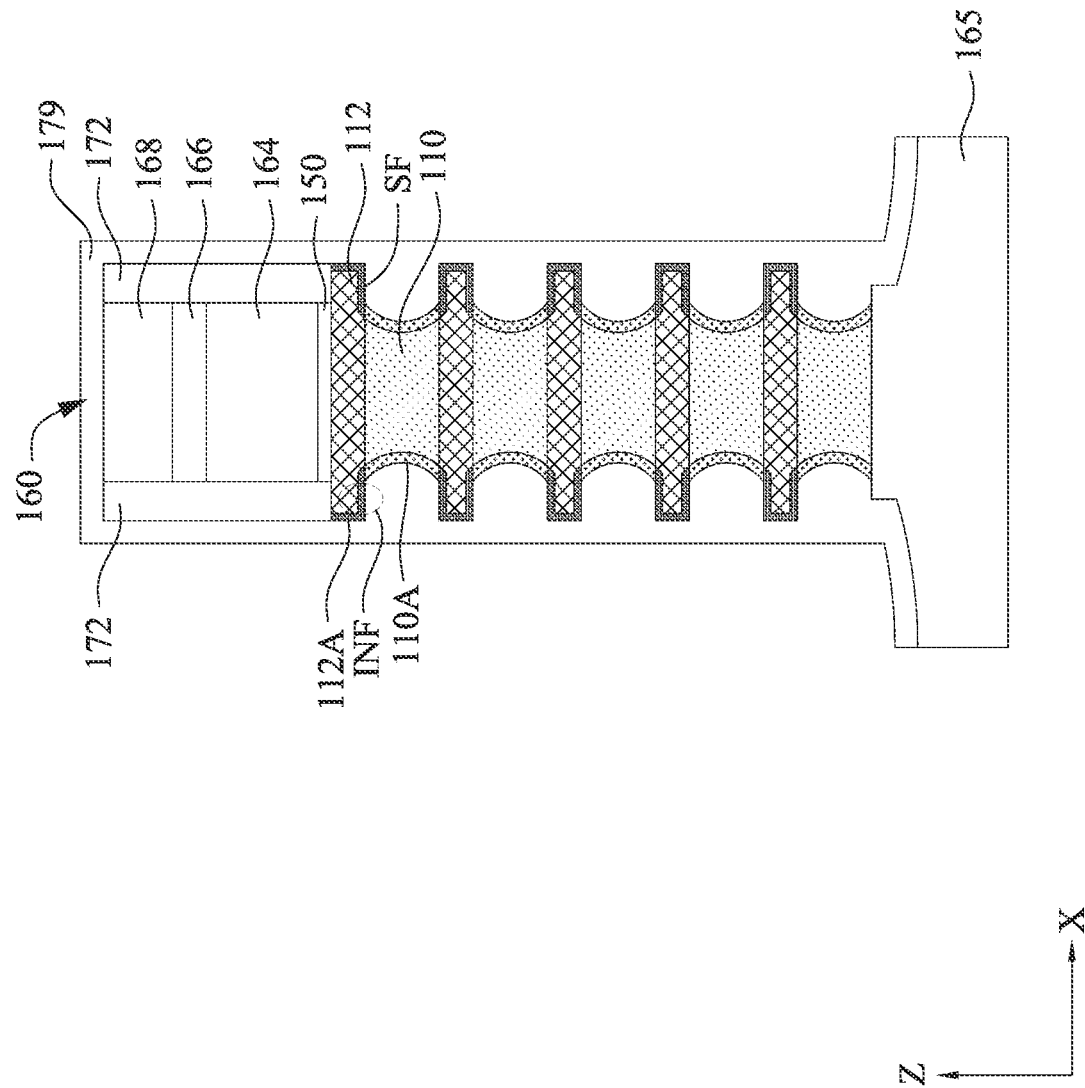

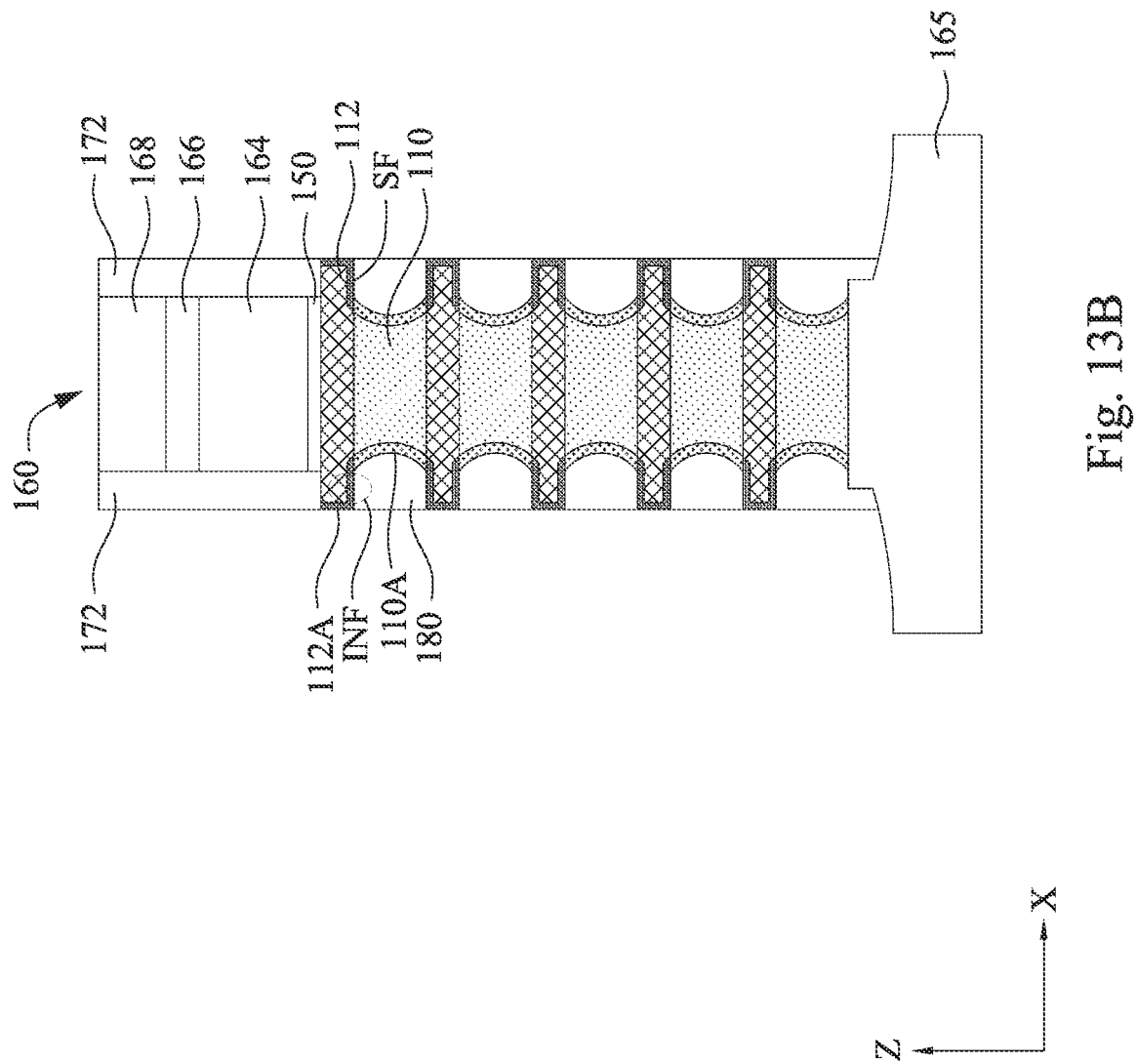

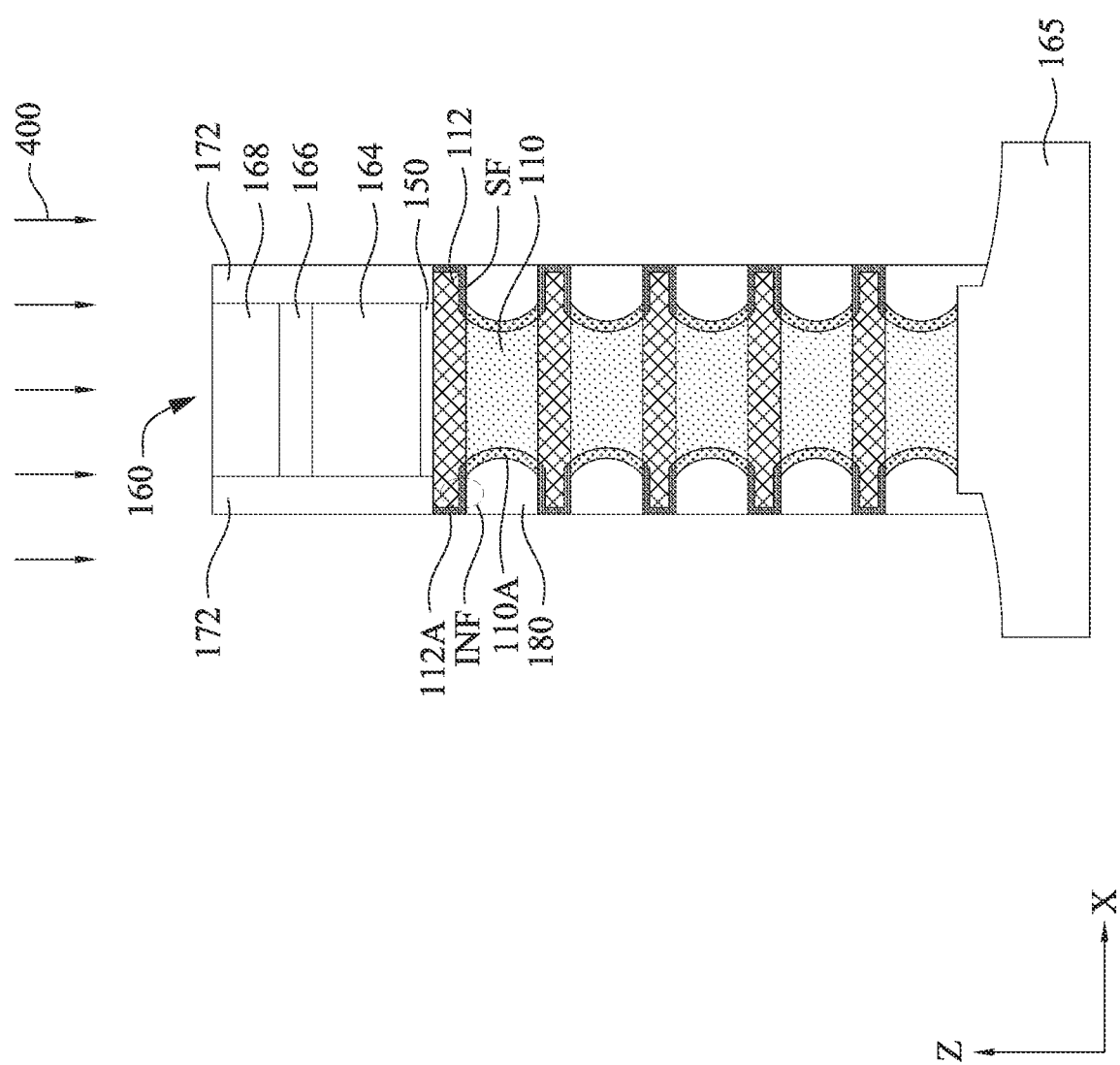

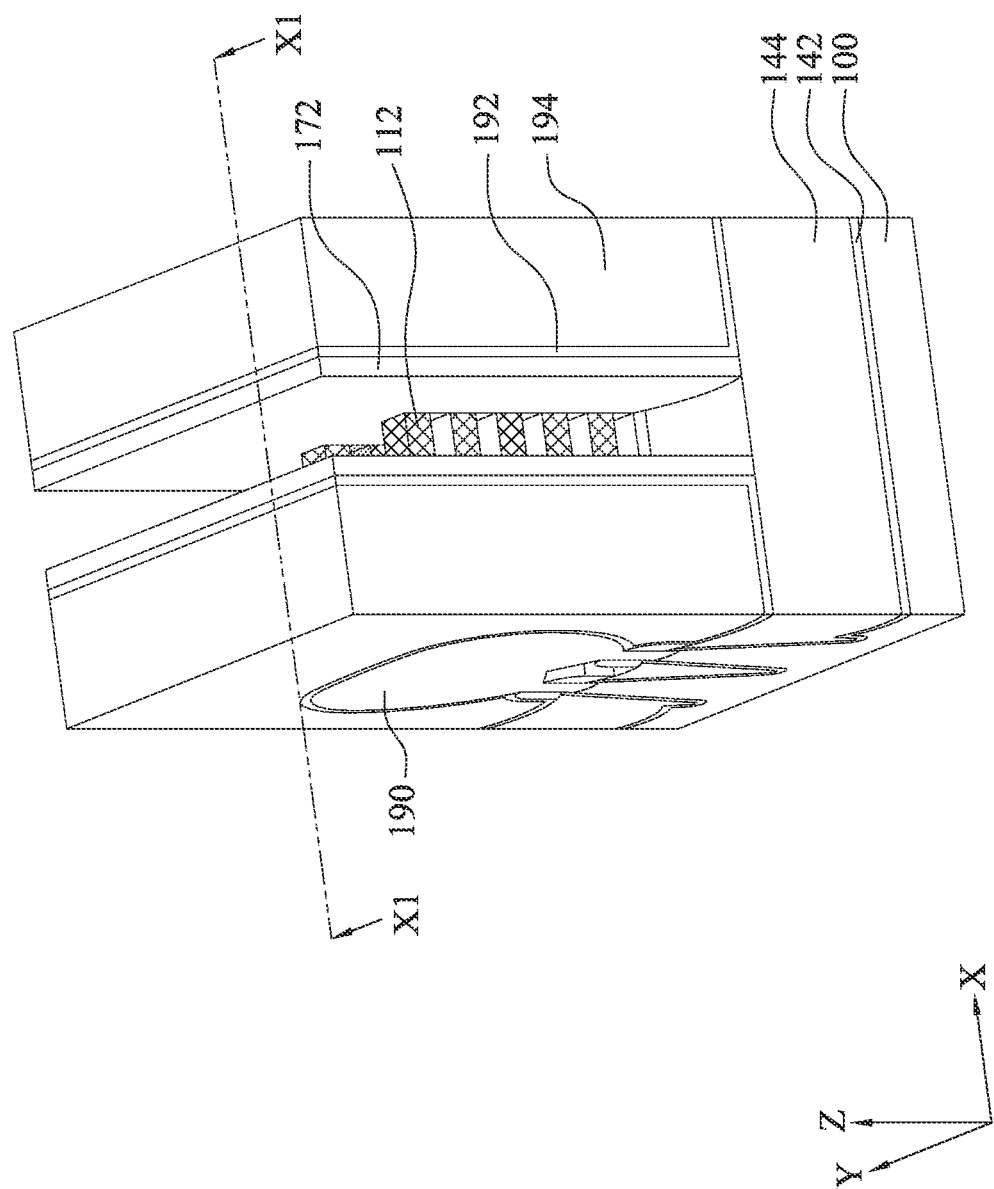

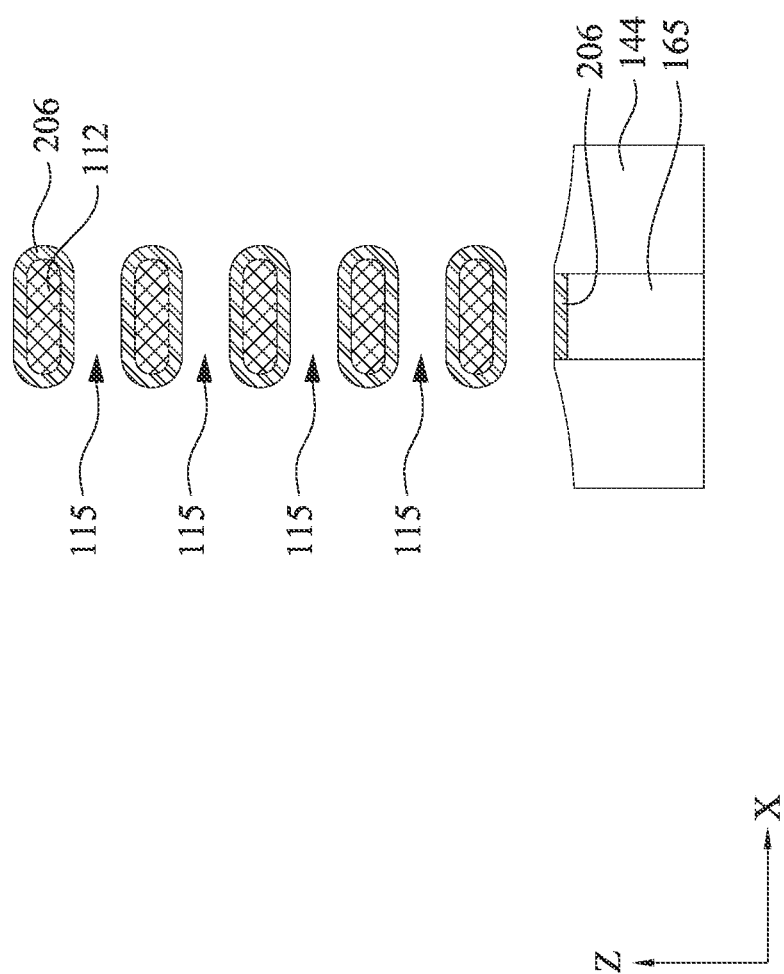

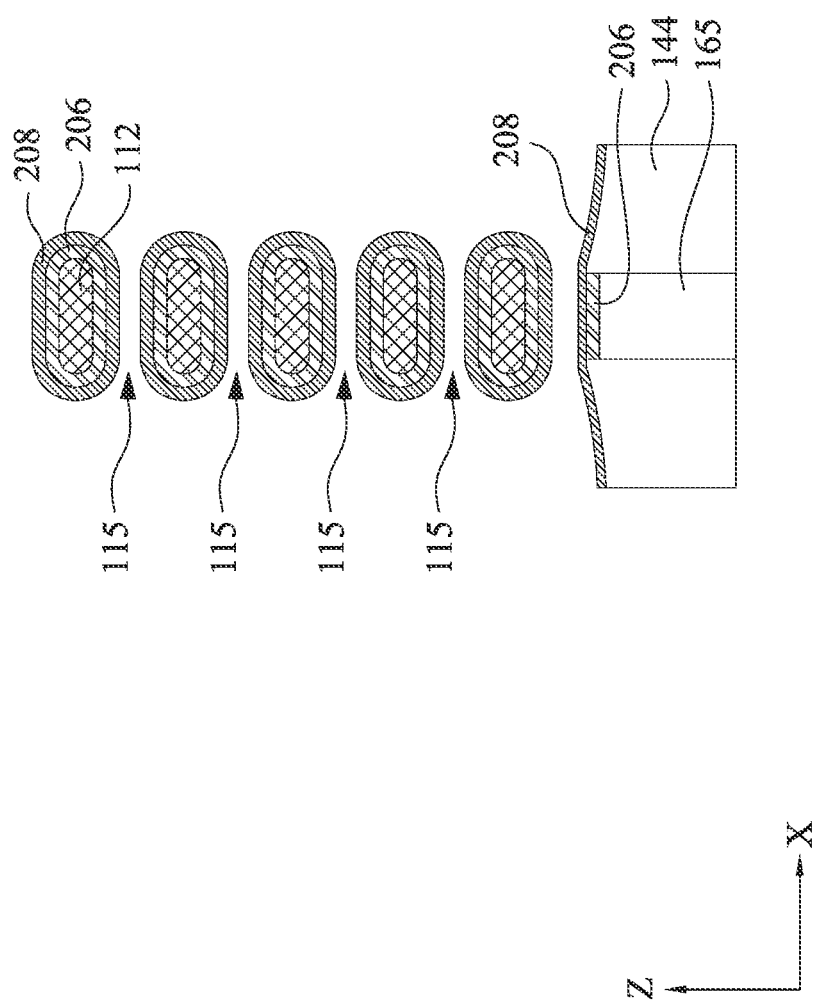

SEMICONDUCTOR DEVICE AND FORMING METHOD THEREOF

BACKGROUND

Transistors are components of modern integrated circuits. To satisfy the trend of increasingly faster speed, the drive currents of transistors need to be increasingly greater. To achieve this increase in performance, the gate lengths of transistors are scaled down. Scaling down the gate lengths leads to undesirable effects known as "short-channel effects," in which the control of current flow by the gates is compromised. Among the short-channel effects are the Drain-Induced Barrier Lowering (DIBL) and the degradation of sub-threshold slope, both of which result in the degradation in the performance of transistors.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides or three sides. The HGAA transistors are compatible with complementary metal-oxide-semiconductor (CMOS) processes, allowing them to be aggressively scaled down while maintaining gate control and mitigating SCEs. However, fabrication of the HGAA transistors can be challenging. For example, nanostructure formation of HGAA transistors by the current methods is not satisfactory in all respects, especially when using a single process, such as a single epitaxial process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12B, 13B and 14B are the cross sectional views corresponding to line X1-X1 of FIGS. 12A, 13A and 14A, respectively.

FIG. 19A is a perspective view of the GAA FET device at different stages of fabrication, according to some embodiments of the disclosure.

FIGS. 21B, 22B, 23B, 24B and 25B are the cross sectional views corresponding to line Y1-Y1 of FIG. 20.

DETAILED DESCRIPTION

Figure 1:
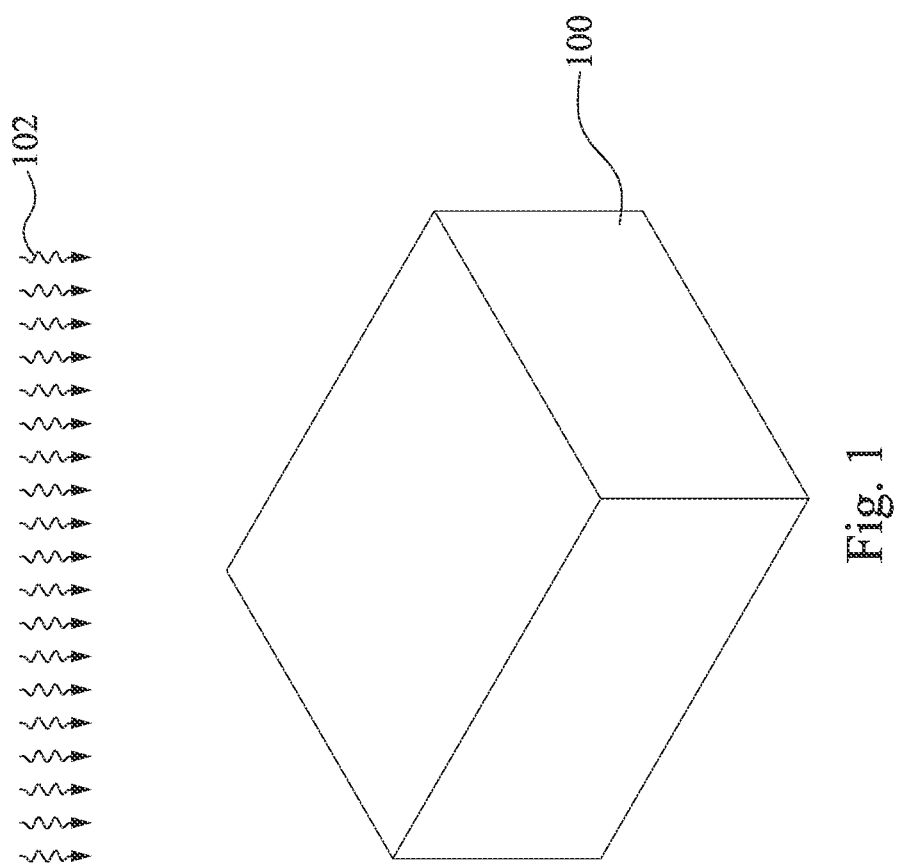
FIGS. 1-8 are exemplary sequential processes for manufacturing the gate-all-around (GAA) FET device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In certain embodiments, the term "about" used in this context means greater or less than the stated value or the stated range of values by a percentage such as 5%, 10%, 15%, etc. of the stated values.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Reference is now made to FIGS. 1-16, which are exemplary sequential processes for manufacturing the gate-all-around (GAA) FET device according to some embodiments of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Referring to FIG. 1, impurity ions (dopants) 102 are optional implanted into a substrate 100 to form a well region. The ion implantation is performed to prevent a punch-through effect. In some embodiments, the substrate 100 may include in its surface region, one or more buffer layers (not shown). The buffer layers can serve to gradually change the lattice constant from that of the substrate to that of the source/drain regions. The substrate 100 may include various regions that have been suitably doped with impurities (e.g., p-type or n-type conductivity). The dopants 102 are, for example, phosphorus for a p-type Fin FET.

Figure 2:
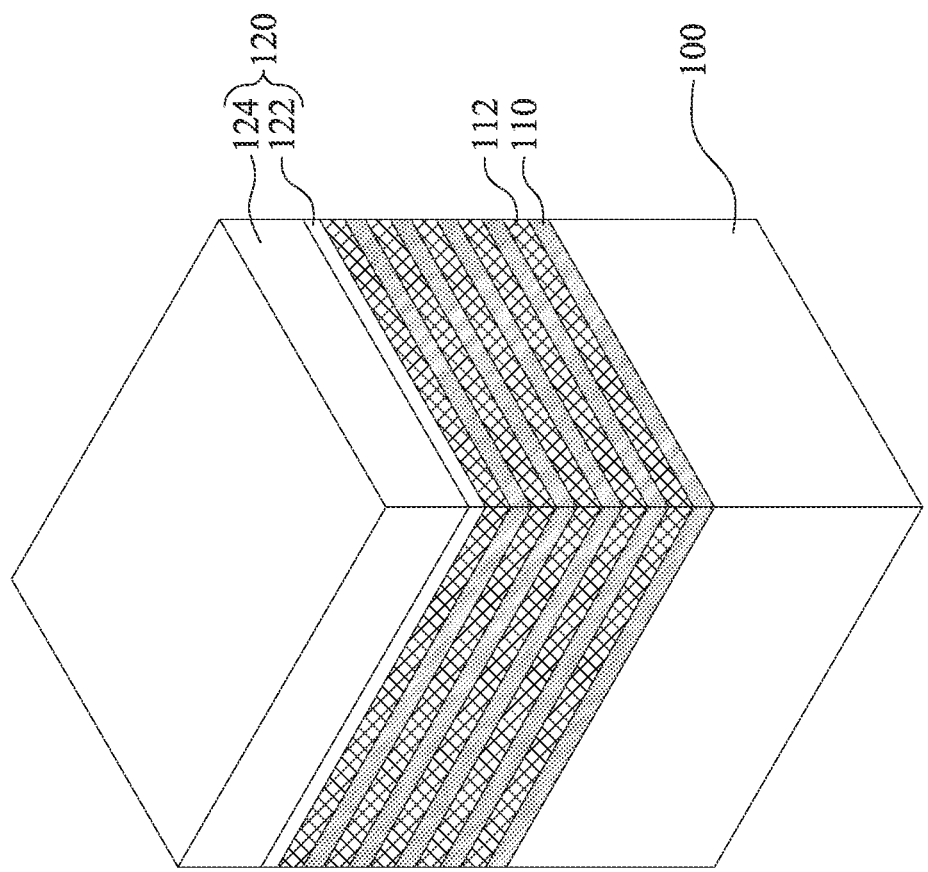

Referring to FIG. 2, stacked semiconductor layers are formed over the substrate 100. The stacked semiconductor layers include first semiconductor layers 110 and second semiconductor layers 112. Further, a mask layer 120 is formed over the stacked layers.

The first semiconductor layers 110 and the second semiconductor layers 112 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 110 and the second semiconductor layers 112 are made of Si, a Si compound, SiGe, Ge or a Ge compound. In FIG. 2, five layers of the first semiconductor layer 110 and five layers of the second semiconductor layer 112 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 110 and the second semiconductor layers 112 are epitaxially formed over the substrate 100. In some embodiments, the bottommost first semiconductor layer 110 (the closest layer to the substrate 100) is thicker than the remaining first semiconductor layers 110.

Figure 3:
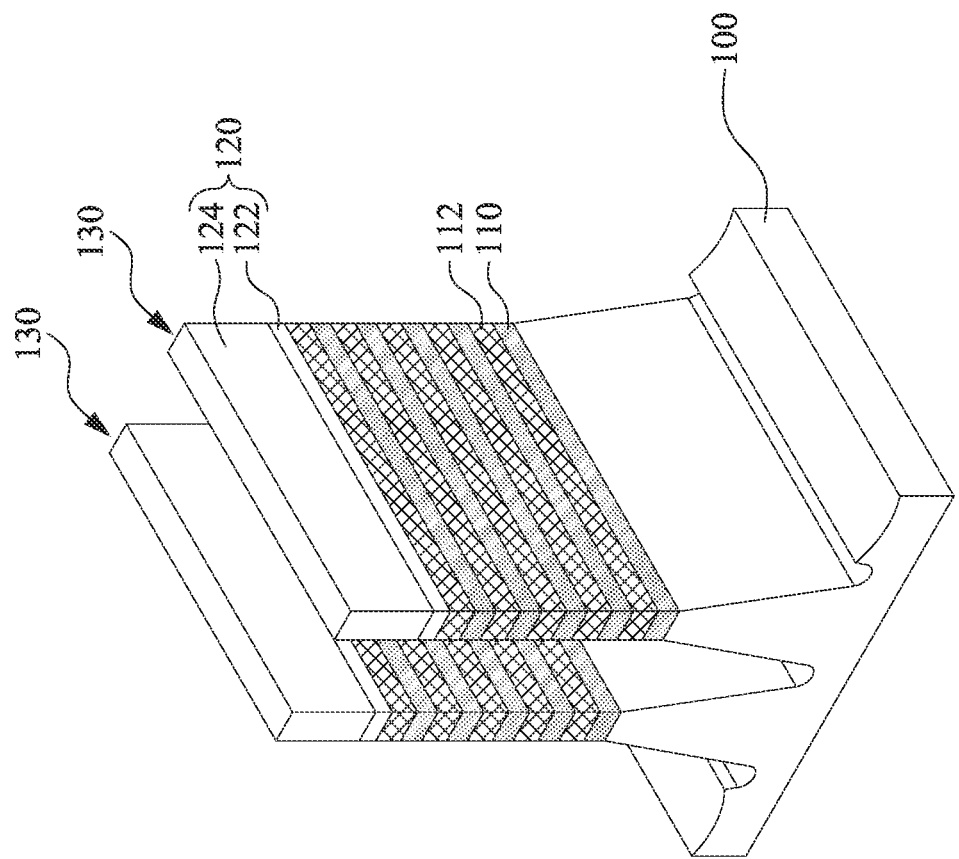

In some embodiments, the mask layer 120 includes a first mask layer 122 and a second mask layer 124. The first mask layer 122 is a pad oxide layer made of a silicon oxide, which can be formed by a thermal oxidation. The second mask layer 124 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 120 is then patterned into a mask pattern by using patterning operations including photo-lithography and etching. Next, as shown in FIG. 3, the stacked layers of the first and second semiconductor layers 110, 112 are patterned by using the patterned mask layer, thereby the stacked layers are formed into fin structures 130 extending in the X direction. In FIG. 3, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

Figure 4:
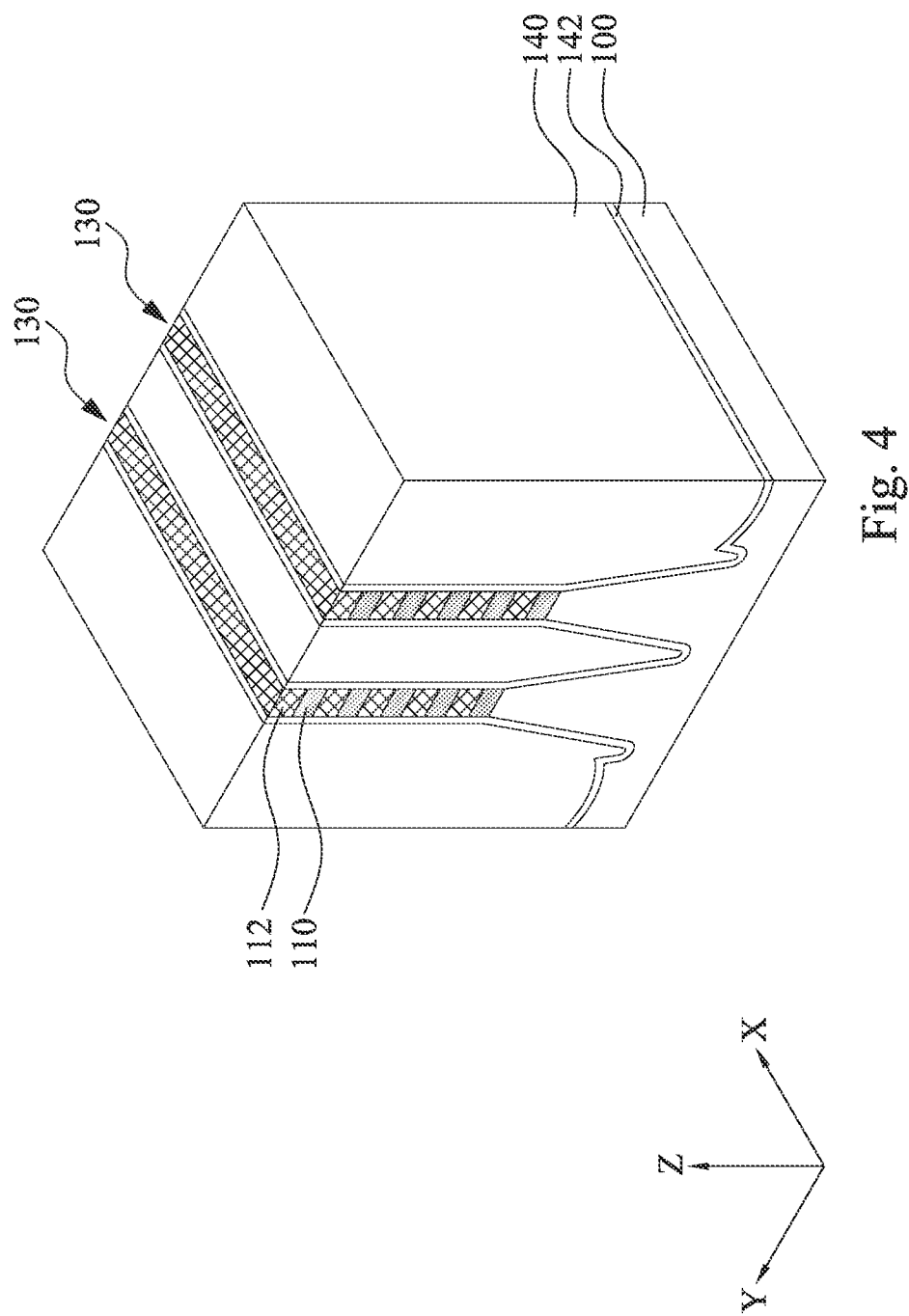

Referring to FIG. 4, after the fin structures 130 is formed, an insulating material layer 140 including one or more layers of insulating material is formed over the substrate so that the fin structures 130 are fully embedded in the insulating material layer 140. The insulating material for the insulating material layer 140 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 140. Then, a planarization operation, such as a chemical mechanical polishing (CMP) method and/or an etch-back method, is performed such that the upper surface of the uppermost second semiconductor layer 112 is exposed from the insulating material layer 140. In some embodiments, a first liner layer 142 is formed over the structure of FIG. 3 before forming the insulating material layer 140. The first liner layer 142 is made of SiN or a silicon nitride-based material (e.g., SiON, SiCN or SiOCN).

Figure 5:
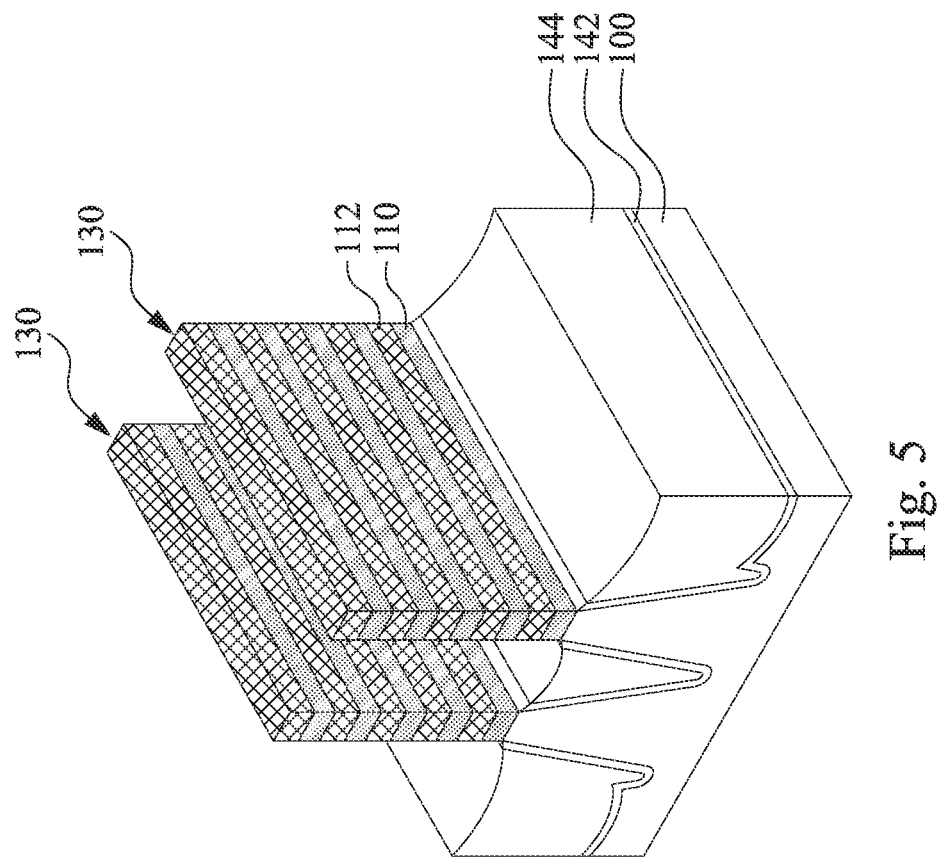

Then, as shown in FIG. 5, the insulating material layer 140 (as shown in FIG. 4) is recessed to form an isolation insulating layer 144 so that the upper portions of the fin structures 130 are exposed. With this operation, the fin structures 130 are electrically insulated from each other by the isolation insulating layer 144, which is also referred to as a STI structure. In some embodiments, the insulating material layer 140 is recessed until the bottommost first semiconductor layer 110 is exposed. The first semiconductor layers 110 are sacrificial layers which are subsequently partially removed, and the second semiconductor layers 112 will serve as channel regions of a GAA FET.

Figure 6:
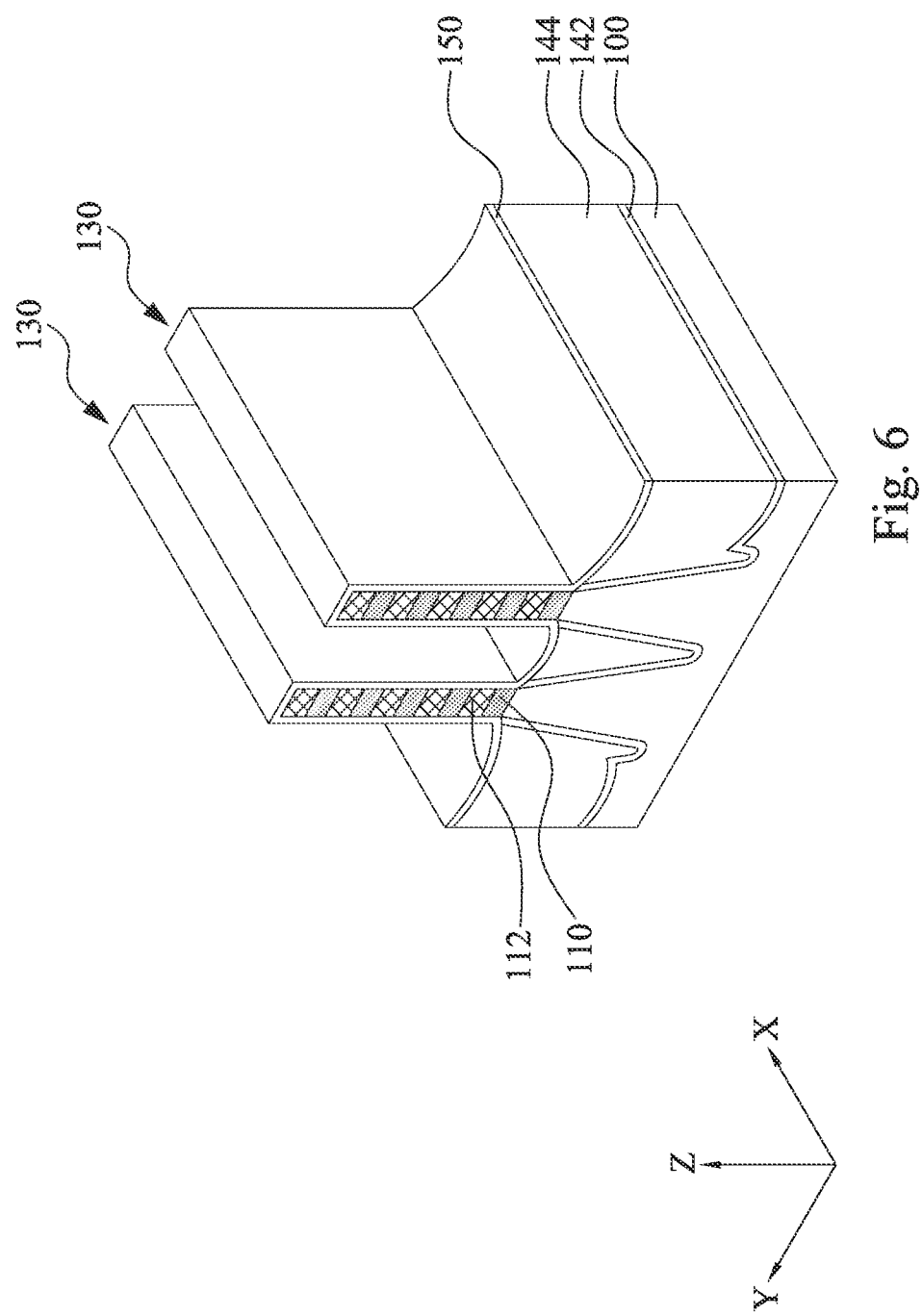

After the isolation insulating layer 144 is formed, a sacrificial gate dielectric layer 150 is formed, as shown in FIG. 6. The sacrificial gate dielectric layer 150 includes one or more layers of insulating material, such as a silicon oxide-based material. In one embodiment, silicon oxide formed by CVD is used.

Figure 7:
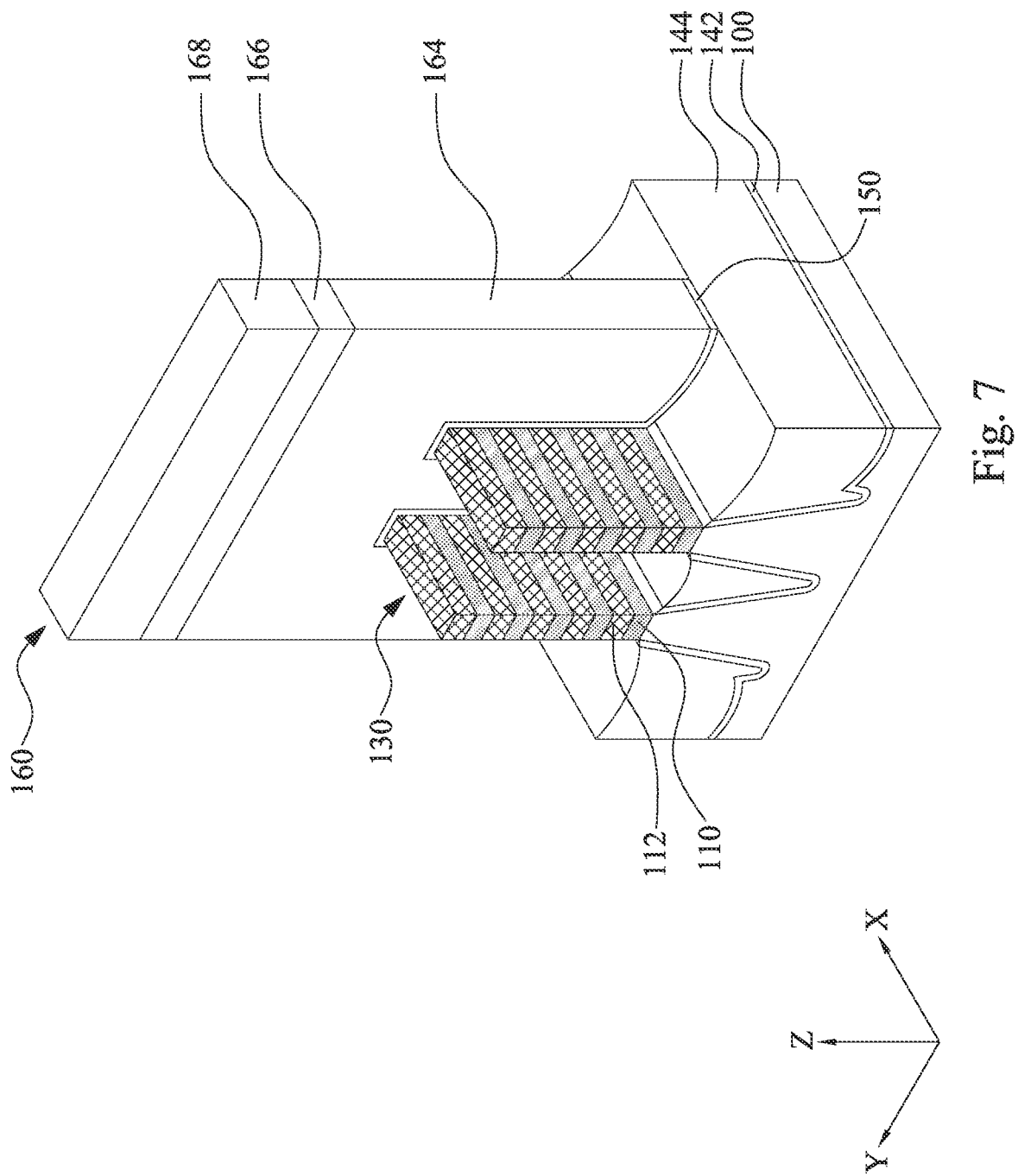

Afterwards, a sacrificial gate layer and a mask layer (e.g., having a pad SiN layer and a silicon oxide mask layer) are formed over the sacrificial gate dielectric layer 150, followed by patterning the mask layer, the sacrificial gate electrode layer and the sacrificial gate dielectric layer 150 into the sacrificial gate structure 160, as shown in FIG. 7. The sacrificial gate structure 160 can be referred to as dummy gate structure. The sacrificial gate structure 160 includes the sacrificial gate dielectric layer 150, the sacrificial gate electrode layer 164 (e.g., poly silicon), the pad SiN layer 166 and the silicon oxide mask layer 168. The stacked layers of the first and second semiconductor layers 110, 112 are partially exposed on opposite sides of the sacrificial gate structure 160, thereby defining source/drain (S/D) regions. In this disclosure, a source and a drain are interchangeably used and the structures thereof are substantially the same.

Figure 8:
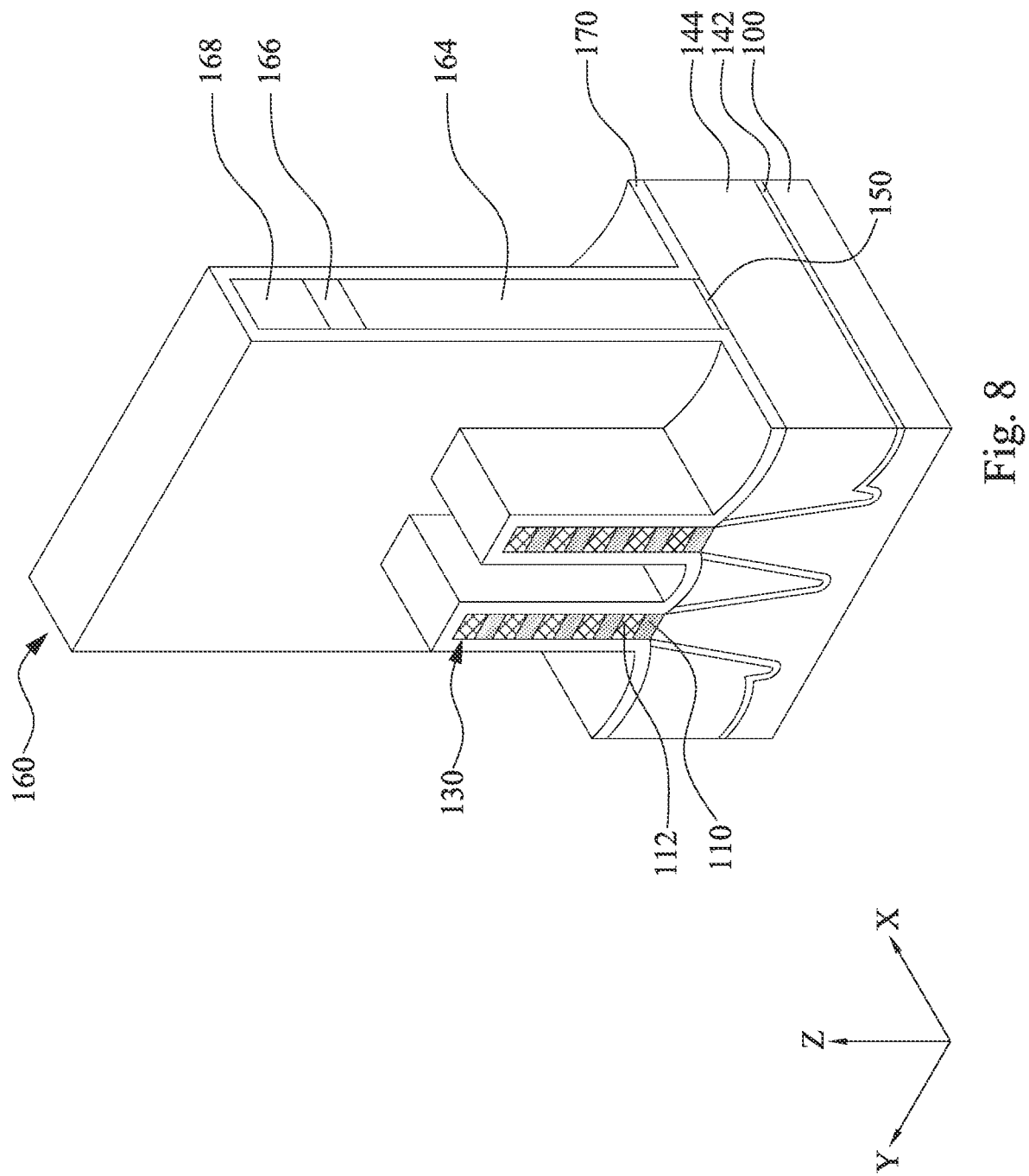

Referring to FIG. 8, after the sacrificial gate structure 160 is formed, a blanket layer 170 of an insulating material for sidewall spacers is conformally formed by using CVD or other suitable methods. The blanket layer 170 is deposited in a conformal manner so that it is formed to have substantially equal thicknesses on vertical surfaces, such as the sidewalls, horizontal surfaces, and the top of the sacrificial gate structure. In some embodiments, the blanket layer 170 is deposited to a thickness in a range from about 2 nm to about 10 nm. In one embodiment, the insulating material of the blanket layer 170 is a silicon nitride-based material, such as SiN, SiON, SiOCN or SiCN and combinations thereof.

Figure 9A:
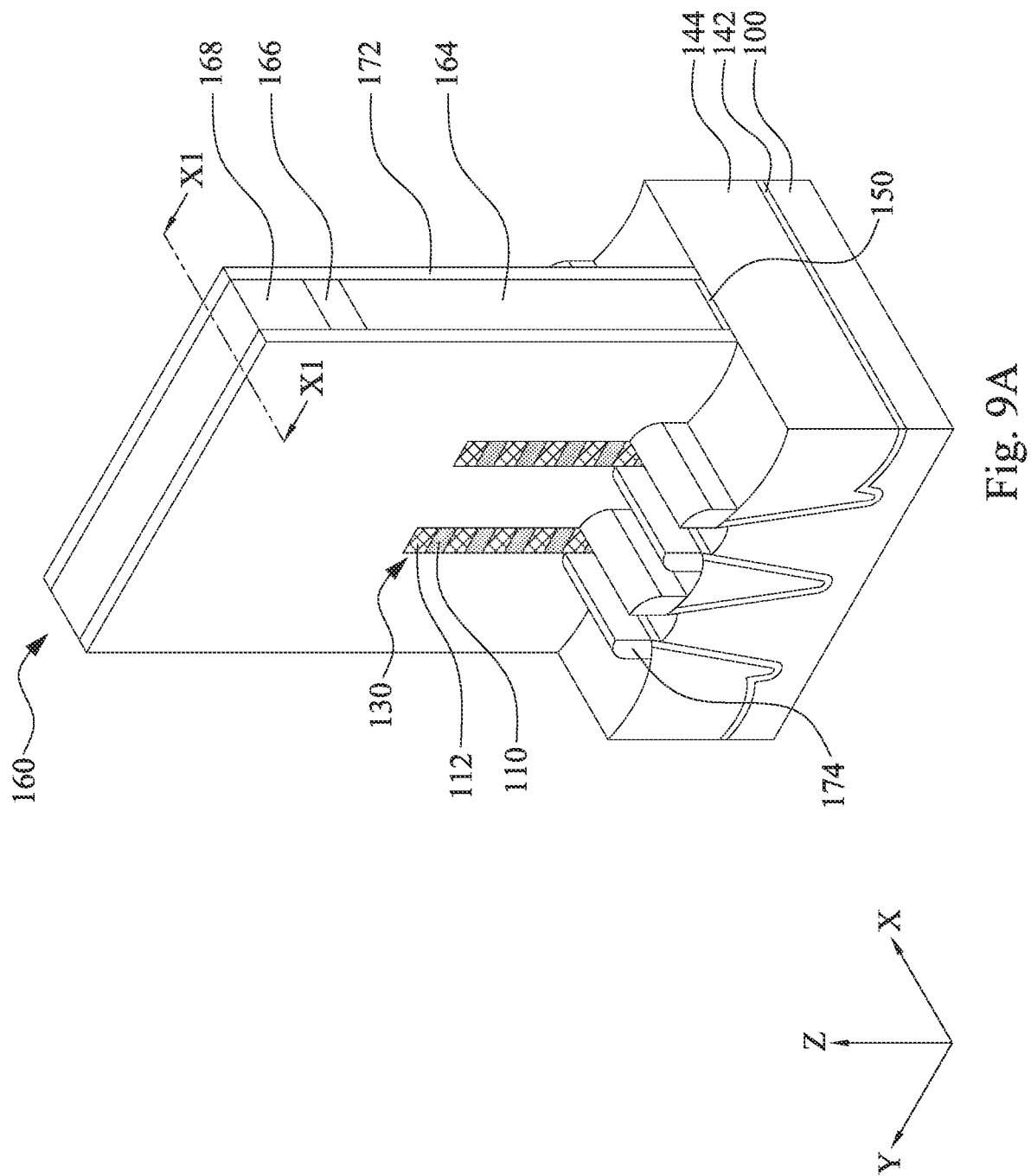
FIG. 9A is a perspective view of the GAA FET device at different stages of fabrication, according to some embodiments of the disclosure.
Figure 9B:
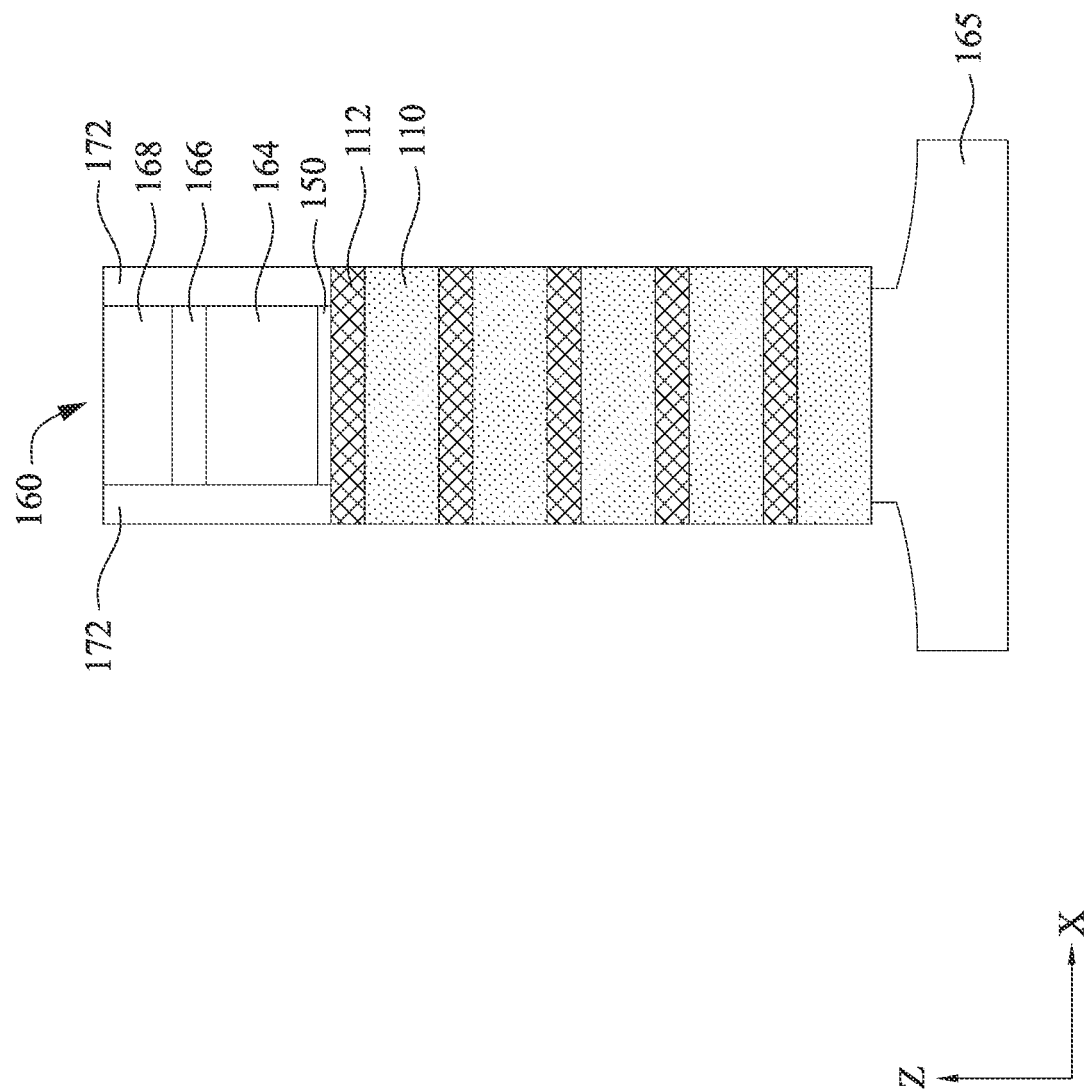
FIG. 9B is a cross sectional view corresponding to line X1-X1 of FIG. 9A.

The blanket layer 170 is then etched using an anisotropic process to form gate sidewall spacers 172 on opposite sidewalls of the sacrificial gate structure 160 and fin sidewall spacers 174 on opposite sidewalls of the fin structures 130, followed by etching exposed portions of the fin structures 130 that extend laterally beyond the gate sidewall spacers 172. The resulting structure is illustrated in FIGS. 9A and 9B, wherein FIG. 9B is the cross sectional view corresponding to line X1-X1 of FIG. 9A. In FIG. 9B, the cross section of the bottom parts of one sacrificial gate structure 160 is illustrated. In some embodiments, the anisotropic process can be control such that no fin sidewall spacers 174 remain on the STI region 144.

The anisotropic etching performed on the blanket layer 170 can be, for example, reactive ion etching (RIE). During the anisotropic etching process, most of the insulating material is removed from horizontal surfaces, leaving the dielectric spacer layer on the vertical surfaces such as the sidewalls of the sacrificial gate structures 160 and the sidewalls of the exposed fin structures 130. The mask layer 168 may be exposed from the sidewall spacers.

Figure 10A:
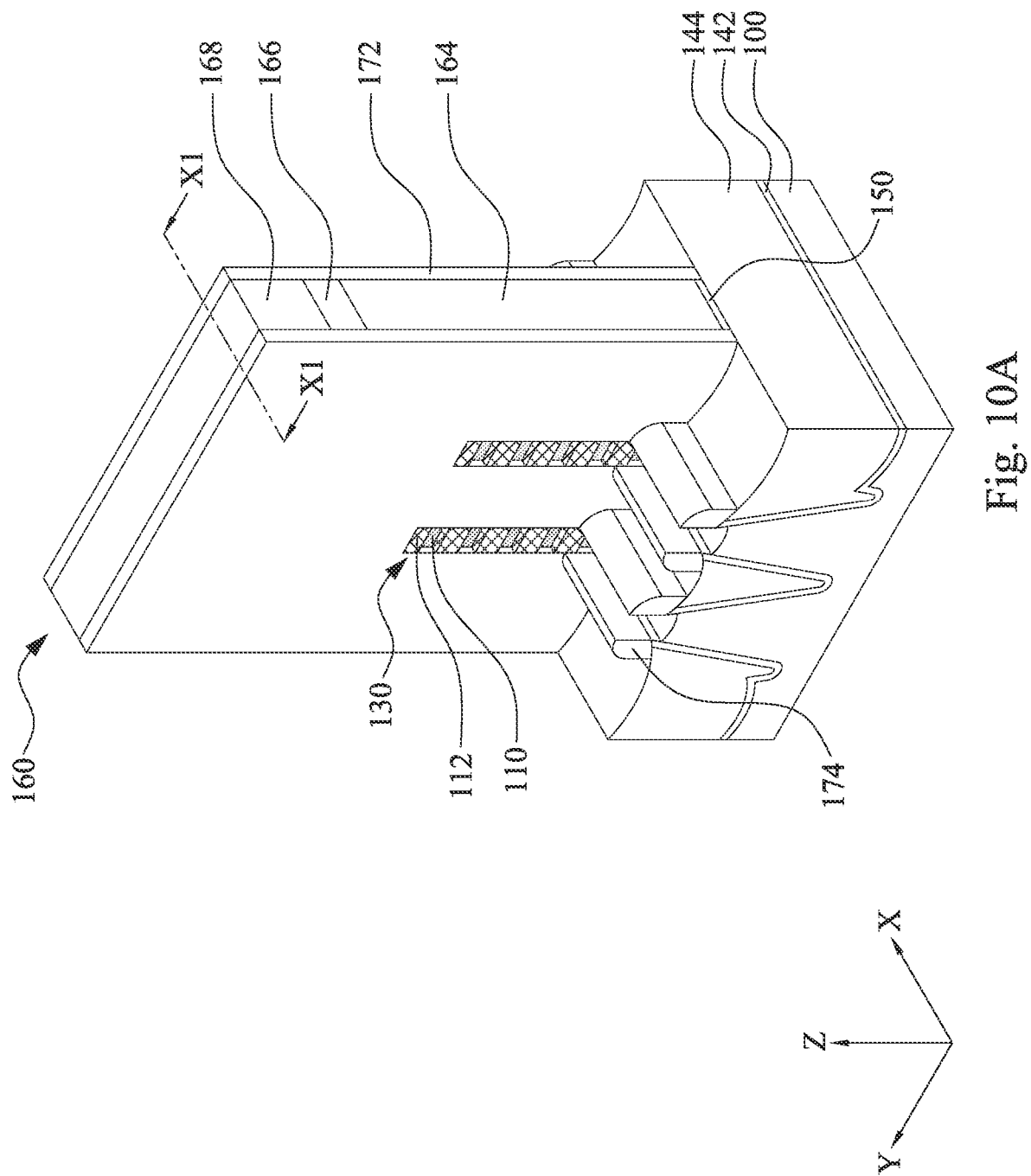
FIG. 10A is a perspective view of the GAA FET device at different stages of fabrication, according to some embodiments of the disclosure.
Figure 10B:
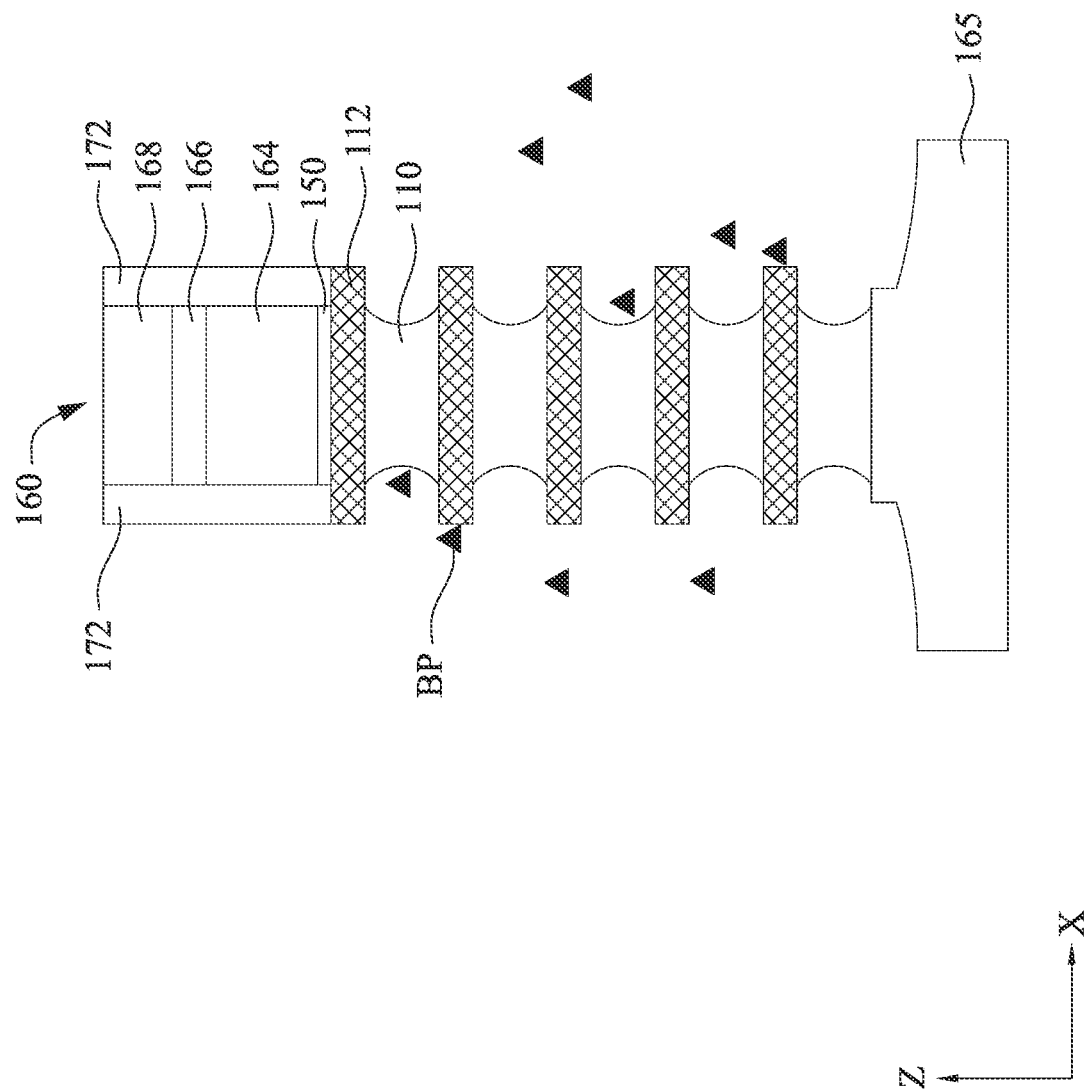
FIG. 10B is a cross sectional view corresponding to line X1-X1 of FIG. 10A.

Subsequently, as shown in FIGS. 10A and 10B, the first semiconductor layers 110 are horizontally recessed (etched) so that the second semiconductor layers 112 laterally extend past opposite end surfaces of the first semiconductor layers 110. In some embodiments, as shown in FIG. 10B, end surfaces of the first semiconductor layers 110 may be substantially vertically aligned with the side surfaces of the sacrificial gate electrode layer 164. Here, "substantially vertically alignment" means the horizontal offset is less than about 1 nm.

During the recess etching of the first semiconductor layers 110 as illustrated in FIGS. 10A and 10B, the second semiconductor layers 112 may be also horizontally etched. The recessed amount of the first semiconductor layers 110 is greater than the recessed amount of the second semiconductor layers 112. In this way, the resulting second semiconductor layers 112 can laterally extend past opposite end surfaces of the first semiconductor layers 110. After recess etching the first semiconductor layers 110, the first semiconductor layers 110 have opposite curved sidewalls. For example, the curved sidewalls are concave sidewalls.

Figure 11:
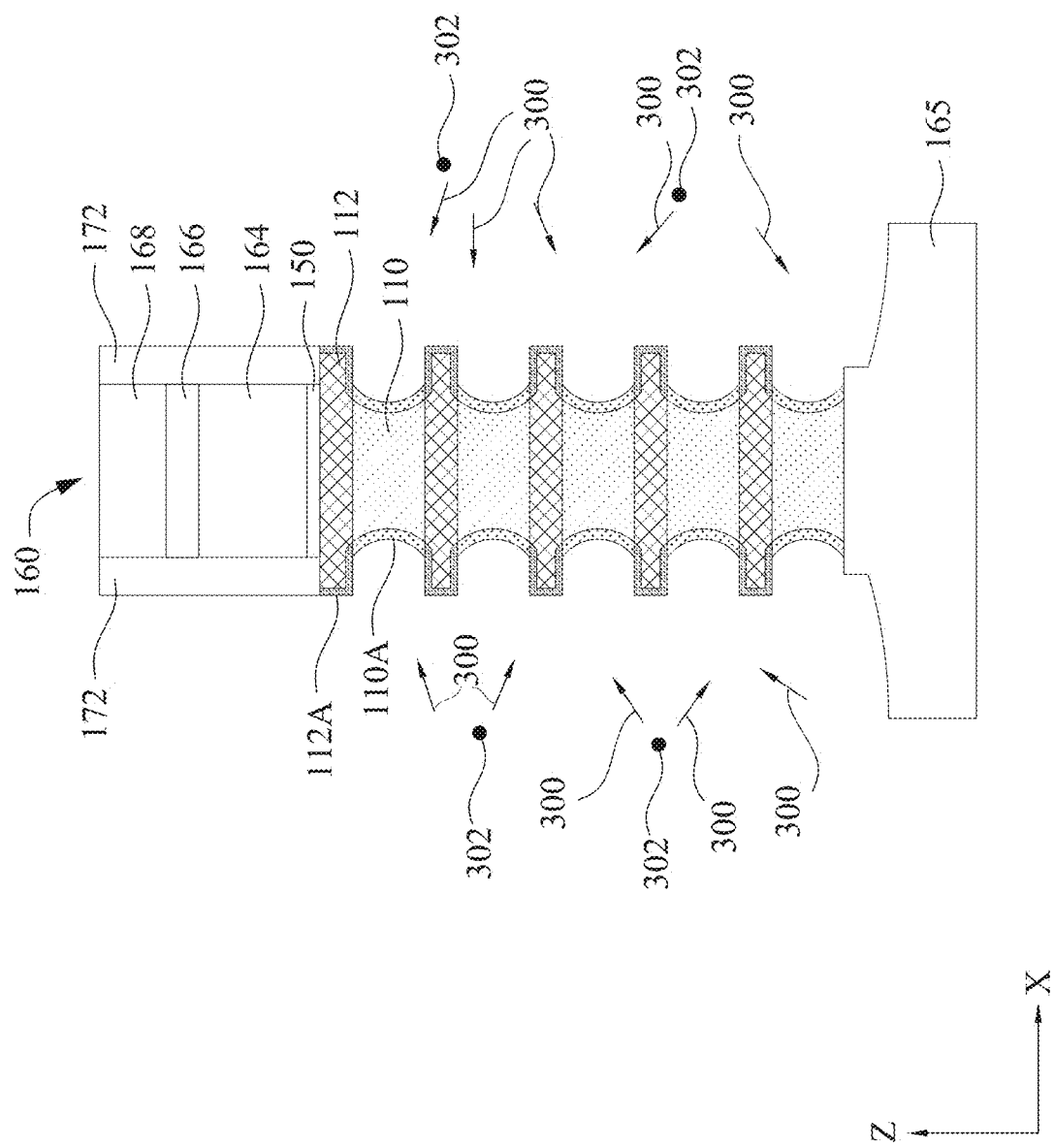
FIG. 11 is a cross-sectional view of the GAA FET device at different stages of fabrication, according to some embodiments of the disclosure.

Recess etching the first semiconductor layers 110 results in byproducts BP attaching to surfaces of the first semiconductor layers 110 and surfaces of the second semiconductor layers 112, as shown in FIG. 10B. Byproducts BP may affect the deposition of inner spacer material layer 179. Therefore, a cleaning process 300 is performed to remove the byproducts BP after recess etching the first semiconductor layers 110, as shown in FIG. 11.

The cleaning process 300 is performed using an oxygen-containing agent 302. In particular, the oxygen-containing agent 302 is an oxidizing agent which can cause an oxidation reaction converting a material to an oxide. For example, the cleaning process 300 is performed without using de-oxidation solution such as dilute hydrofluoric (HF) and CERTAS® etch, which tend to remove oxides and without using SiCoNi plasma, which is performed using the process gases including $NH_3$ and $NF_3$. For example, the cleaning process 300 may include wet chemical treatment (e.g., SC1 (standard cleaning solution 1) clean or SC2 (standard cleaning solution 2) clean), ozone ($O_3$) treatment, or oxygen radical-containing treatment.

The SC1 clean follows according to one exemplary embodiment. The SC1 clean includes a mixture of ammonium hydroxide, hydrogen peroxide, and de-ionized water ($NH_4OH:H_2O_2:H_2O$) at a ratio of 1:4:20 at 40° C. to 70° C. for 1 minutes to 10 minutes. The SC2 clean follows according to one exemplary embodiment.

In some embodiments where the cleaning process 300 is performed using ozone treatment (e.g., a de-ionized ozone treatment), the first semiconductor layers 110 and the second semiconductor layers 112 are exposed to ozone. Ozone is a metastable form of oxygen that may be generated in a microwave or UV generator and which readily dissociated into $O_2$ and the oxygen radical O*. The ozone may be generated remotely from the substrate 100 and be flowed over to the substrate 100 without subjecting the substrate 100 to plasma.

The de-ionized ozone treatment may be an ozone enhanced low temperature thermal oxidation process carried out within a temperature range of about 0° C. to about 50° C. and at a pressure of about 760 torr. De-ionized ozone concentration may be varied from 10 ppm to 50 ppm.

The oxygen radical-containing treatment includes oxygen ($O_2$) ashing procedure. For example, the oxygen radicals in the oxygen radical-containing treatment is performed at a chamber pressure of 0.5 torr to 10 torr, at RF power of about 2000 Watts to about 4000 Watts, and a standard cubic centimeter per minute (sccm) flow of $O_2$ at about 1000 sccm to about 9000 sccm at a second period. The $O_2$ ashing procedure generates oxygen radicals in the oxygen ashing step come in contact with the first semiconductor layers 110 and the second semiconductor layers 112 and thereby form non-volatile oxide regions.

The cleaning process 300 using the oxygen-containing agent 302 causes the oxidation of the outer regions of the first semiconductor layers 110 and outer regions of the second semiconductor layers 112. For example, passivation regions 110A are formed in the outer regions of the first semiconductor layers 110 due to the oxidation. Also, passivation regions 112A are formed in the outer regions of the second semiconductor layers 112 due to the oxidation.

In other words, each of the first semiconductor layers 110 has an outer region having a composition different from a composition of an inner region of each of the first semiconductor layers 110. Each of the second semiconductor layers 112 has an outer region having a composition different from a composition of an inner region of each of the second semiconductors layers 112. The passivation regions 110A and 112A include oxides. The compositions of the passivation regions 110A and 112A depend on the materials of the first semiconductor layer 110 and the second semiconductor layer 112. In other words, the passivation regions 110A and 112A include materials of the first semiconductor layers 110 and second semiconductor layers 112, respectively. For example, in some embodiments where the first semiconductor layers 110 include silicon germanium, the passivation regions 110A may include silicon germanium oxide, silicon oxide, germanium oxide or a combination thereof. In some embodiments where the second semiconductor layers 112 include silicon, the passivation regions 112A may include silicon oxide.

The passivation regions 110A and 112A can prevent the germanium atoms from diffusing out the first semiconductor layers 110 during a subsequent process, for example, during forming the inner spacers (see FIGS. 12A and 12B), as will be described later in greater detail. Thus the germanium percentage in the first semiconductor layers 110 is not degraded. One of the passivation regions 112A has an L-shaped cross section.

Figure 12A:
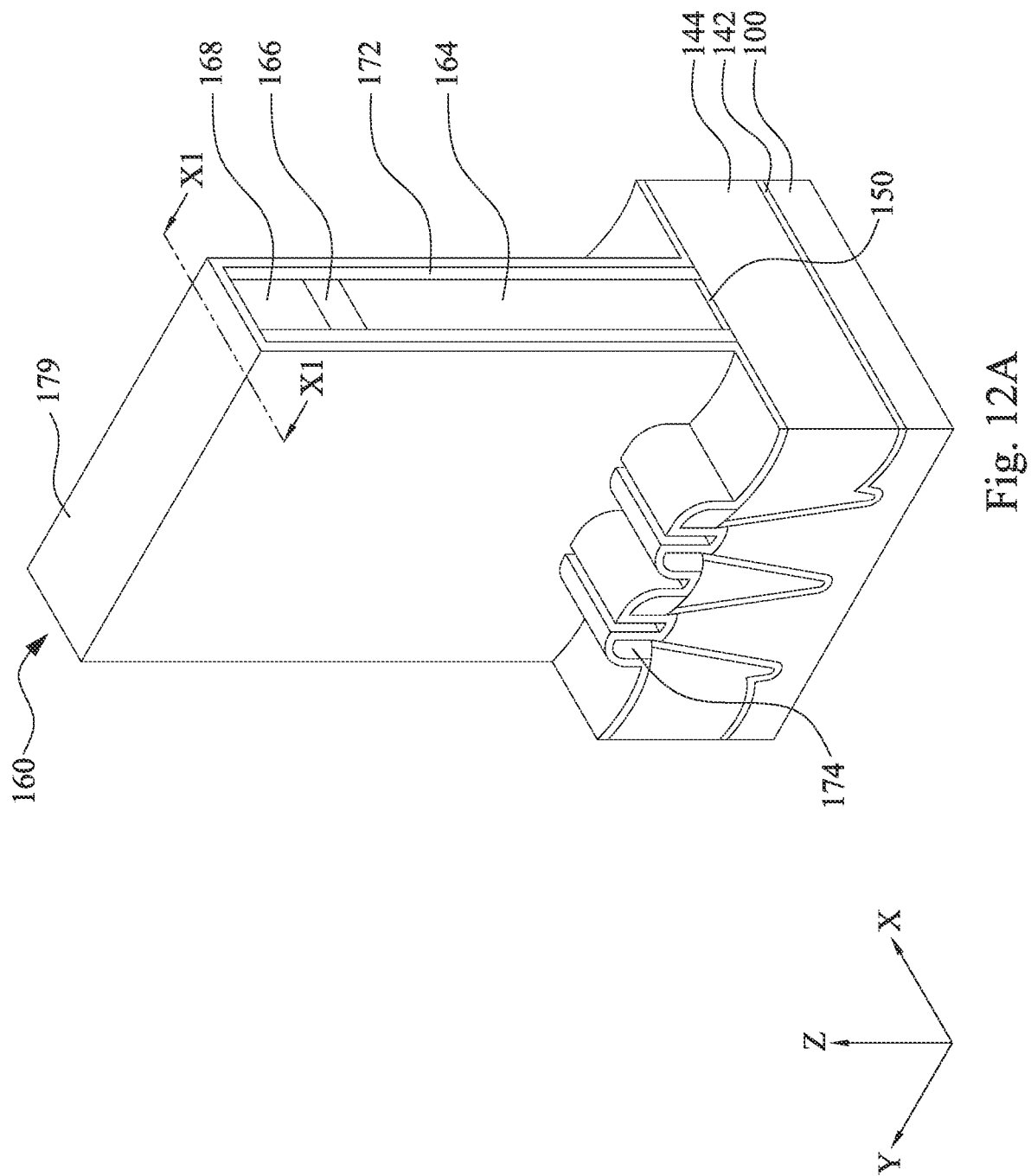
FIGS. 12A, 13A and 14A are perspective views of the GAA FET device at different stages of fabrication, according to some embodiments of the disclosure.

Reference is made to FIGS. 12A and 12B. After the cleaning process 300, an inner spacer material layer (e.g., low k materials) 179 is deposited. The inner spacer material layer 179 and the passivation region 112A have different compositions. In some embodiments, the inner spacer material layer 179 includes insulating material such as low-k material. For example, the inner spacer material layer 179 may include nitrides such as SiCN, SiON, SiCON, SiN or the like. Each of the passivation region 112A of the second semiconductor layers 112 has a surface SF facing another one of the passivation region 112A. Each of the passivation region 112A of the second semiconductor layers 112 and the inner spacer material layer 179 have an interface INF. The inner spacer material layer 179 is formed as a conformal layer so that vertical portions and horizontal portions of the inner spacer material layer 179 have similar thicknesses.

Figure 13A:
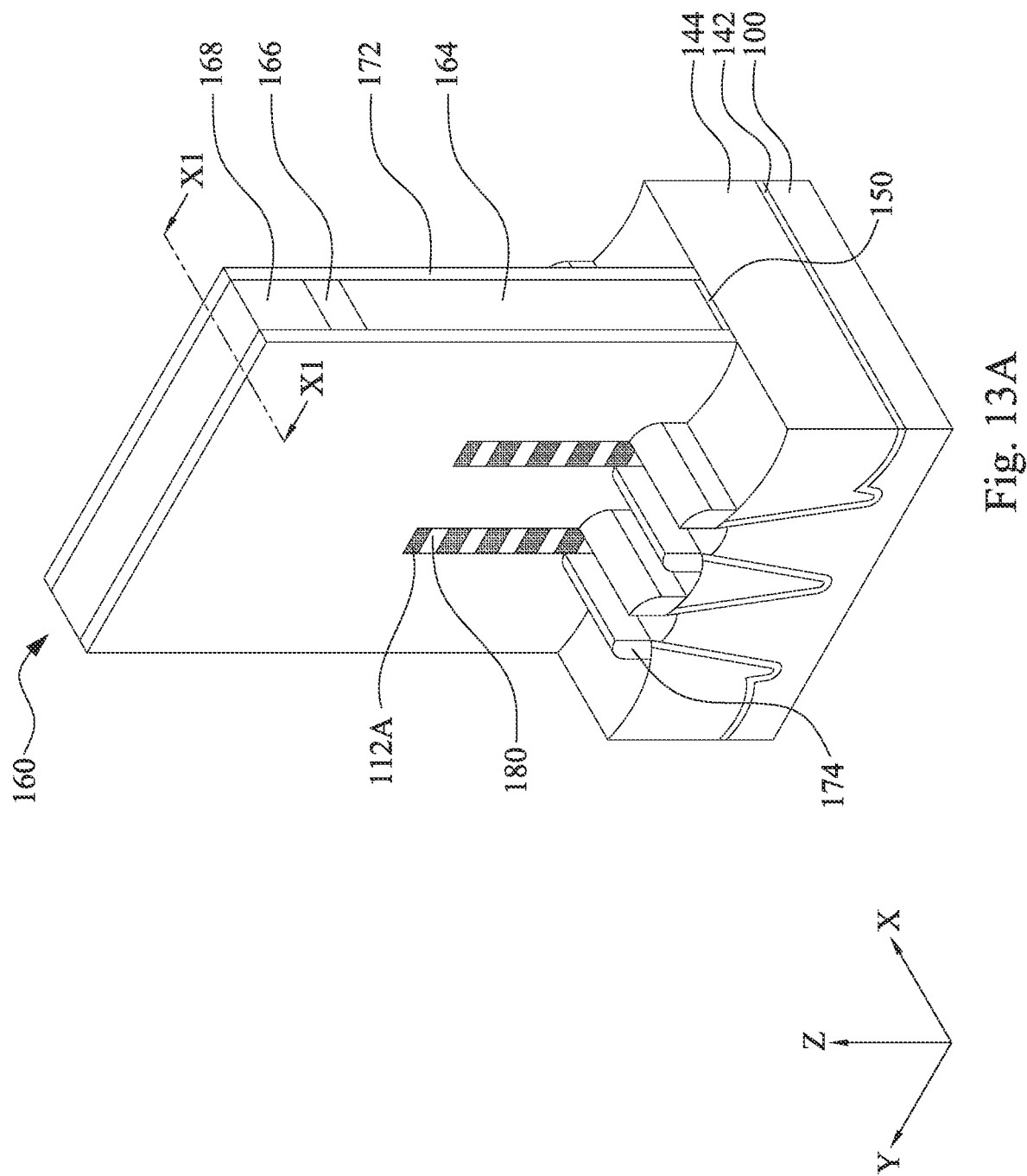

Reference is made to FIGS. 13A and 13B. After depositing the inner spacer material layer 179, etching back the inner spacer material layer 179 by an anisotropic etching process to remove the inner spacer material layer 179 from the substrate 100 to form inner spacers 180 on the first semiconductor layers 110 and vertically between the corresponding second semiconductor layers 112. In particular, the inner spacers 180 are in contact with the passivation regions 110A of the first semiconductor layers 110 and the passivation regions 112A of the second semiconductor layers 112. Since the first semiconductor layers 110 have opposite curved sidewalls, the inner spacers 180 include curved inner sidewalls. For example, the curved inner sidewalls of the inner spacers 180 are convex toward the first semiconductor layers 110. The passivation regions 110A are conformal to the curved inner sidewalls of the inner spacers 180.

As mentioned above, the passivation regions 110A and the passivation regions 112A can help prevent the germanium atoms in the first semiconductor layers 110 from diffusing out during forming the inner spacers 180. If the germanium atoms in the first semiconductor layers 110 diffuse out, these diffused germanium atoms may accumulate at the interfaces INF and at the surfaces SF which disadvantageously affect the charges at the interfaces INF and the surfaces SF and thus cause fix charge densities at the interfaces INF and the surfaces SF difficult to be controlled.

Figure 14A:
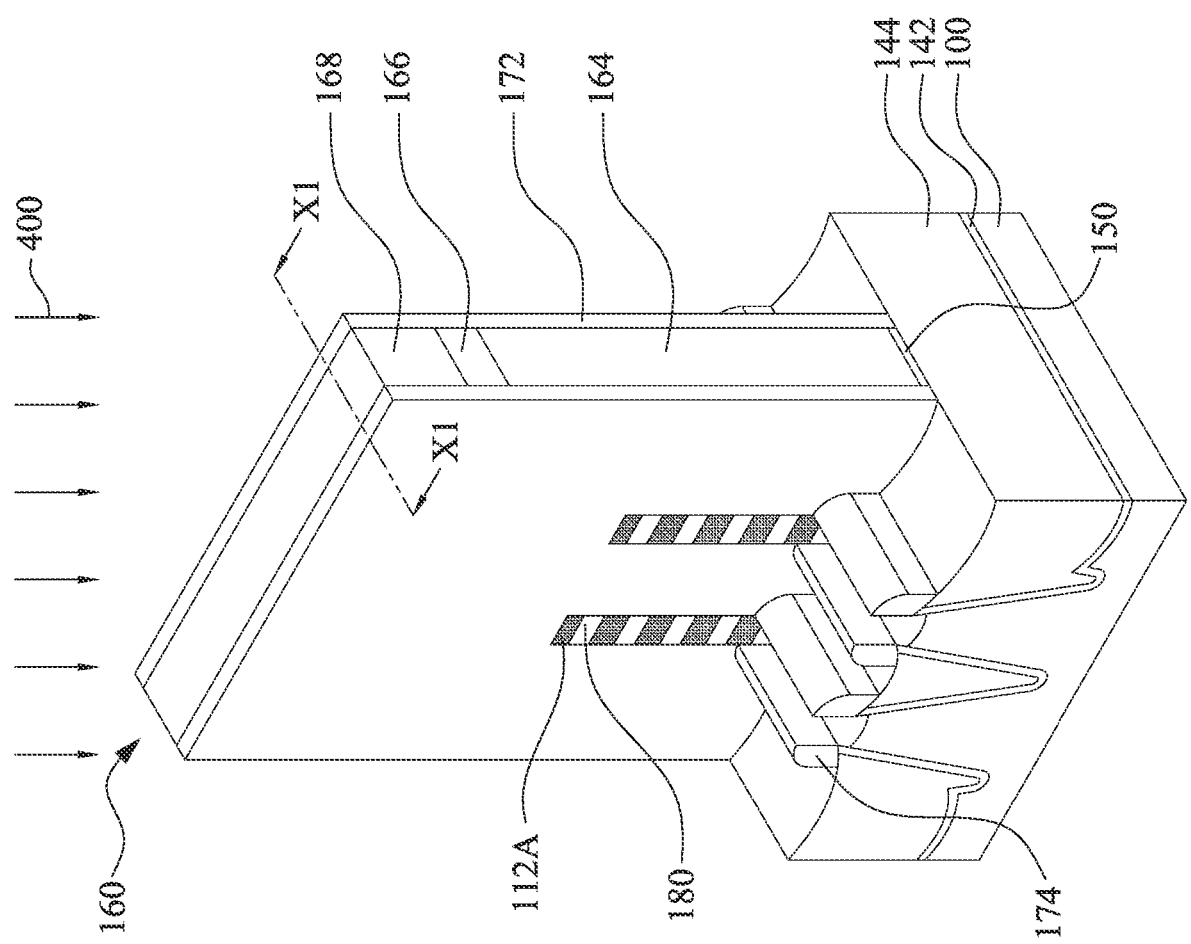
Figure 14C:
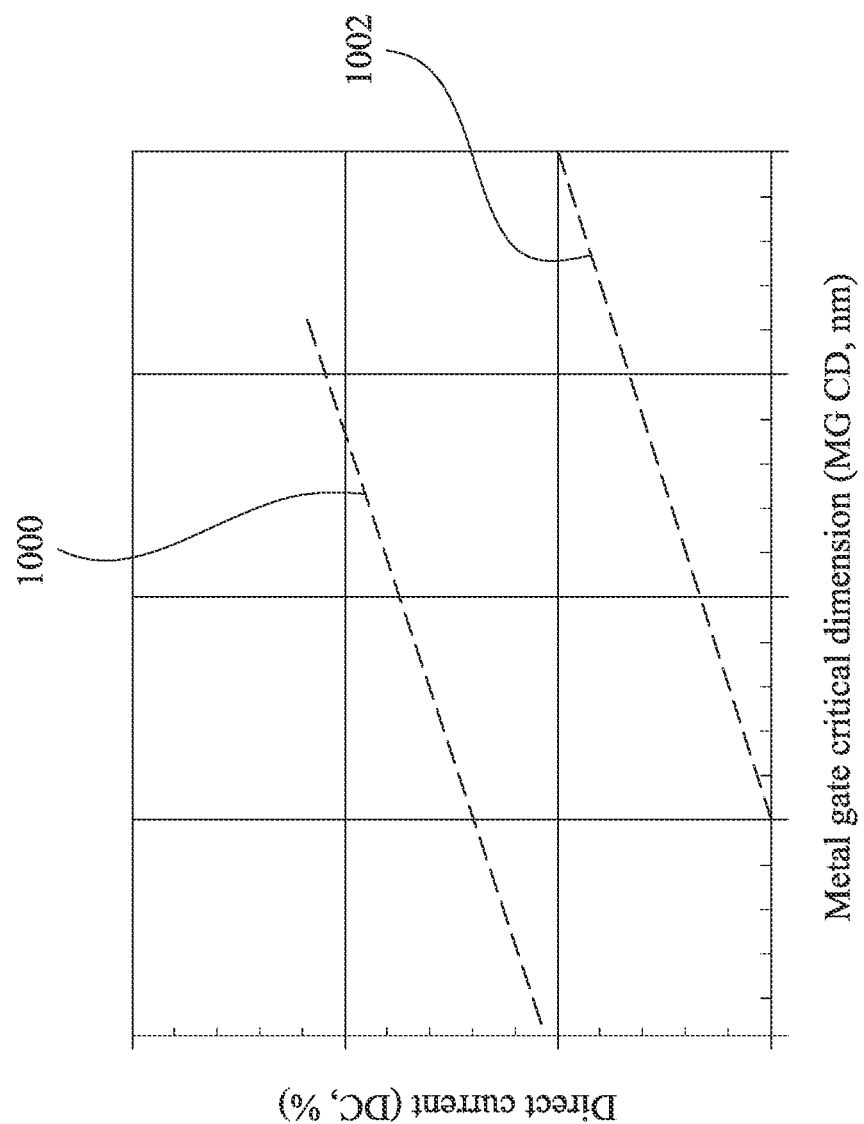
FIG. 14C illustrates a graph showing the direct current (DC) versus metal gate (MG) dimension.

Reference is made to FIGS. 14A and 14B. After the inner spacers 180 are formed, a high temperature (e.g., anneal) process 400 is performed. The anneal process is conducted at a temperature in a range from 400° C. to 600° C. In some embodiments, the anneal process may be a thermal anneal process such as steam anneal. The anneal time may be in a range from 0.5 hr to 8 hr. The anneal process can tune the fix charge densities at the interfaces INF between the second semiconductor layers 112 and the inner spacers 180. For example, such anneal process can increase the negative charge densities at the interfaces IF and thus help retain the dopants in a subsequently formed source/drain (S/D) epitaxial layers (see FIG. 16) and maintain the low resistance of the S/D epitaxial layers such that the carrier mobility of the S/D epitaxial layers can be enhanced. FIG. 14C illustrates a graph showing the direct current (DC) versus metal gate (MG) dimension. Line 1000 shows devices with inner spacers undergone a anneal process. Line 1002 shows devices with inner spacers that did not undergo the anneal process. As compared the line 1000 with the line 1002, it is clear that the anneal process results in an increased direct current flowing through the channel layers (See FIGS. 19A and 19B). As a result, the device performance, such as wafer acceptable test (WAT) performance, can be improved.

Figure 15:
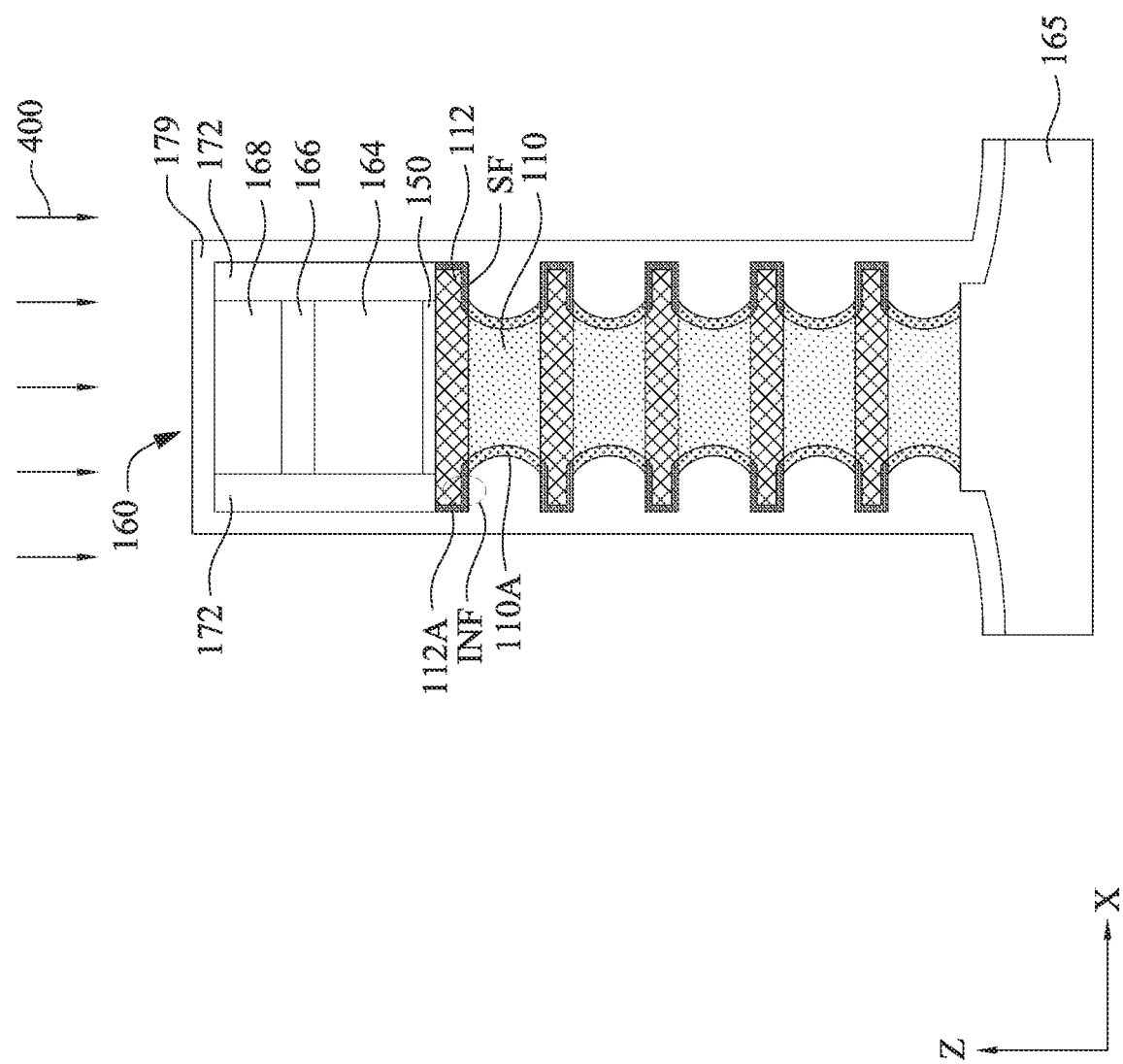
FIG. 15 is a cross-sectional view of the GAA FET device at different stages of fabrication, according to some other embodiments of the disclosure.

In some other embodiments, the high temperature process 400 is performed prior to etching back the inner spacer material layer 179, as shown in FIG. 15. In other words, after depositing the inner spacer material layer 179, the high temperature process 400 is performed.

Figure 16:
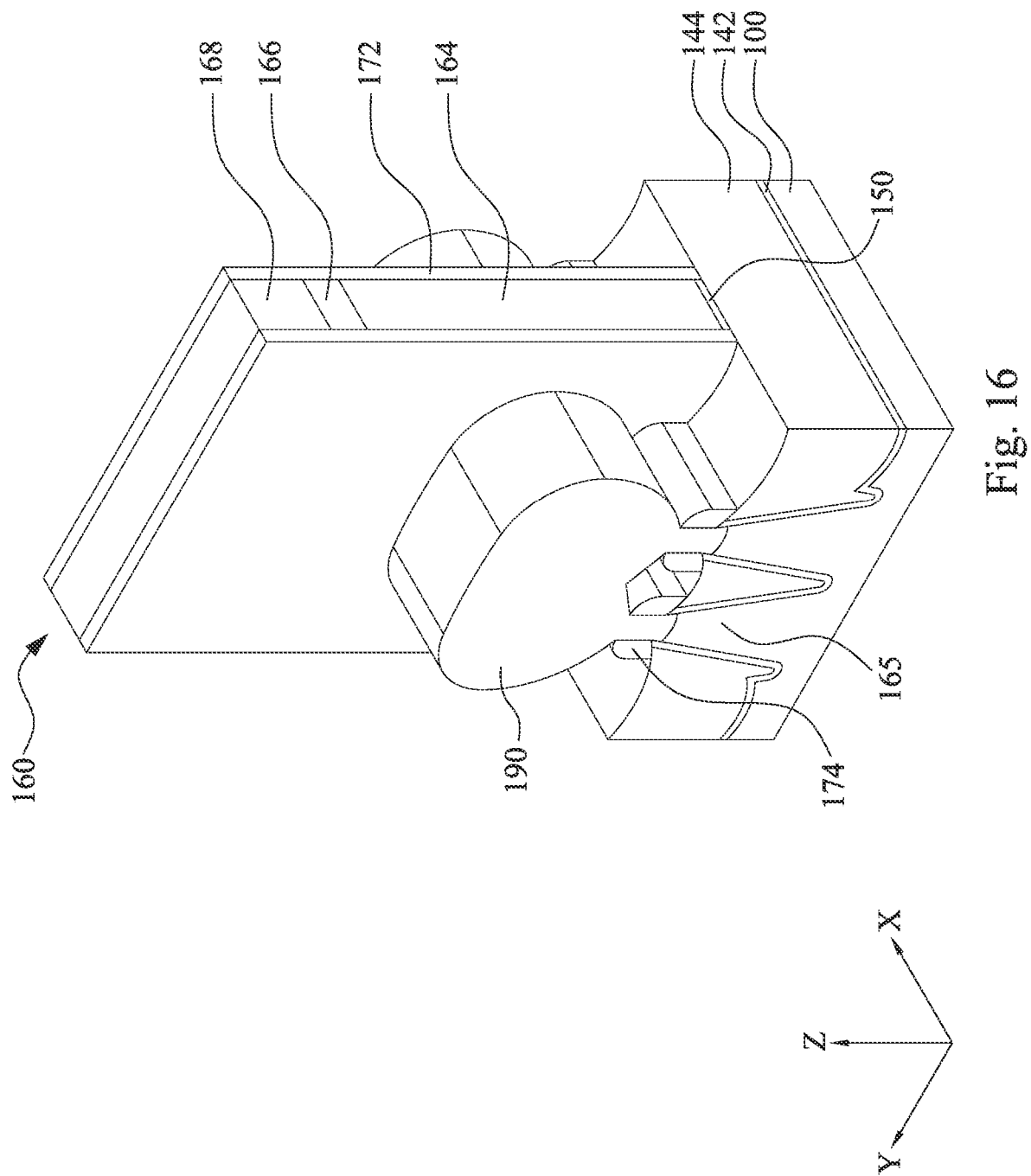
FIGS. 16, 17 and 18 are perspective views of the GAA FET device at different stages of fabrication, according to some embodiments of the disclosure.

After the inner spacers 180 are annealed, source/drain (S/D) epitaxial layers 190 are epitaxially grown from the exposed recessed fins 165 between the fin sidewall spacers 174, as shown in FIG. 16. The S/D epitaxial layers 190 include one or more layers of SiGe doped with p-type dopants (e.g., boron, aluminum, or other suitable p-type dopants) for a p-channel FET. The S/D epitaxial layers 190 include one or more layers of SiC or SiP doped with n-type dopants (e.g., phosphorous, arsenic, or other suitable n-type dopants) for an n-channel FET. The S/D epitaxial layers 190 are formed by an epitaxial growth method using CVD, ALD or molecular beam epitaxy (MBE). In some embodiments, the epitaxial layers 190 grown from neighboring recessed fins 165 of the substrate 100 merge above the STI 144 and form a void in some embodiments. In some other embodiments, the epitaxial layers 190 grown from neighboring recessed fins 165 do not merged.

Figure 17:
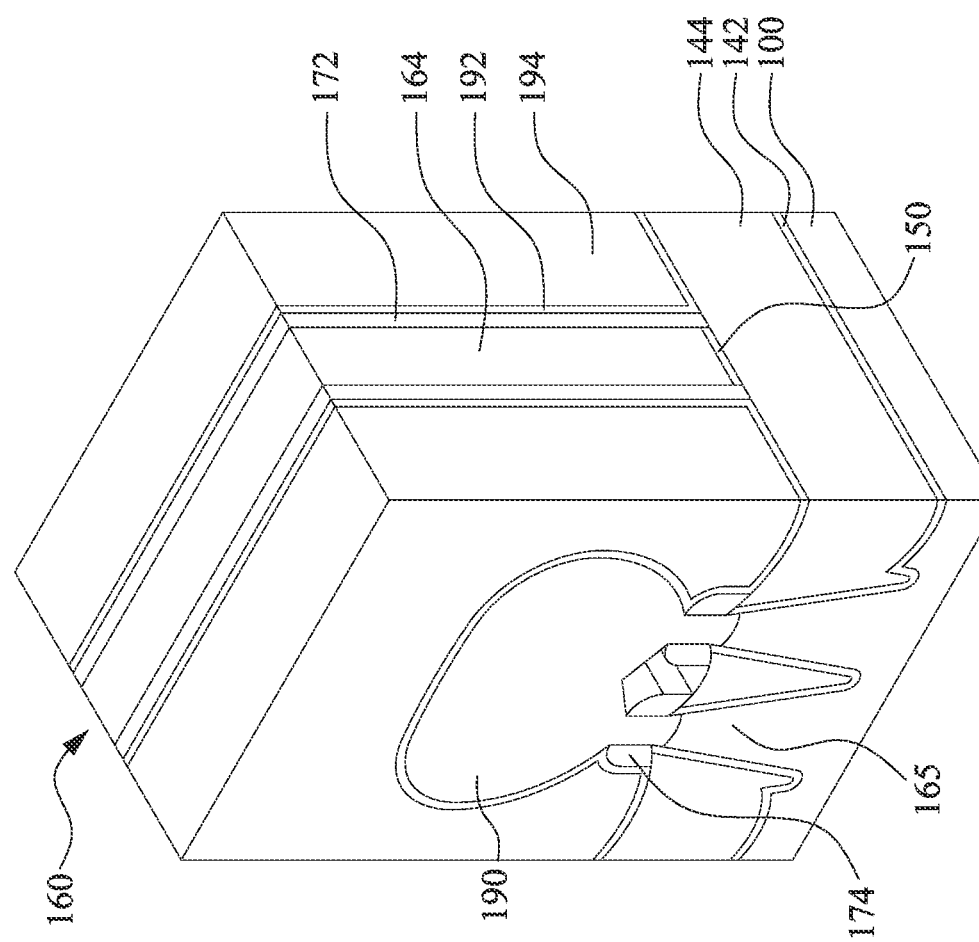

Subsequently, a second liner layer 192 is formed and then an interlayer dielectric (ILD) layer 194 is formed, as shown in FIG. 17. The second liner layer 192 is made of a silicon nitride-based material, such as SiN, and functions as a contact etch stop layer in the subsequent etching operations. The materials for the ILD layer 194 include compounds comprising Si, O, C and/or H, such as silicon oxide, SiCOH and SiOC. Organic materials, such as polymers, may be used for the ILD layer 194.

As shown in FIG. 17, after the ILD layer 194 is formed, a planarization operation, such as CMP, is performed, so that the top portion of the sacrificial gate structure 160 is exposed.

Figure 18:
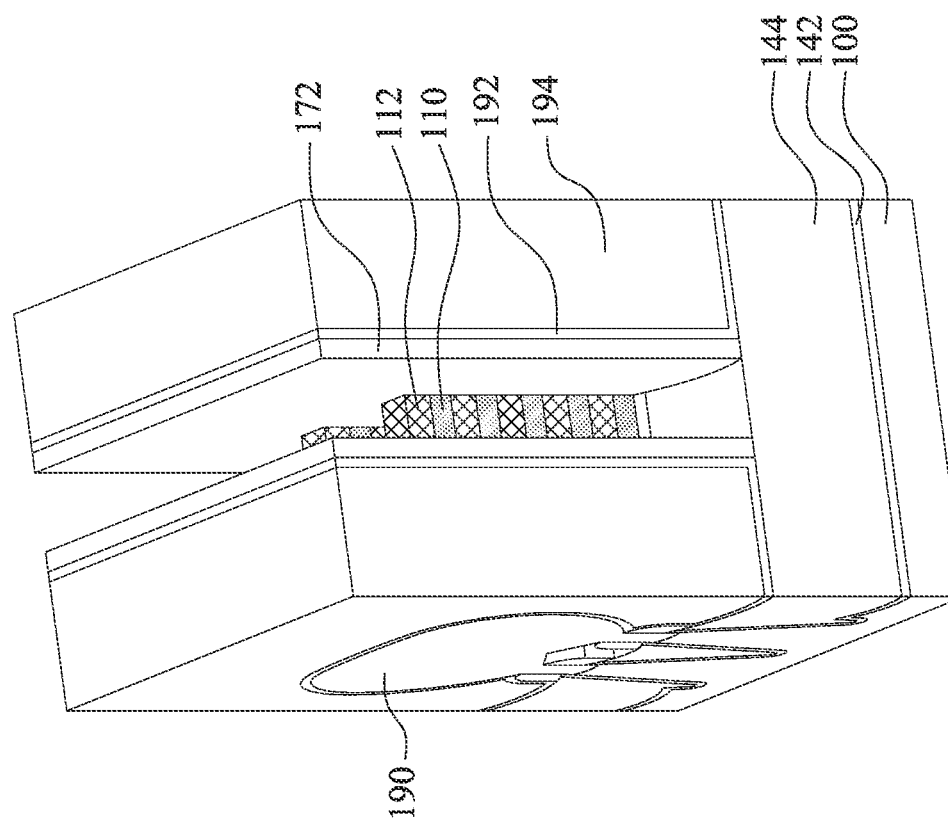

Next, as shown in FIG. 18, the sacrificial gate electrode layer 164 (see FIG. 9B) and sacrificial gate dielectric layer 150 (see FIG. 9B) are removed, thereby exposing the fin stack of the first and second semiconductor layers 110, 112 and a gate trench is formed between the gate sidewall spacers 172.

The ILD layer 194, the second liner layer 192, the gate sidewall spacers 172, and/or the inner spacers 180 protect the S/D epitaxial layers 190 during the removal of the sacrificial gate structures 160. The sacrificial gate structures 160 can be removed using plasma dry etching and/or wet etching. When the sacrificial gate electrode layer 164 is polysilicon and the ILD layer 194 is silicon oxide, a wet etchant such as a TMAH solution can be used to selectively remove the sacrificial gate electrode layer 164. The sacrificial gate dielectric layer 150 is thereafter removed using plasma dry etching and/or wet etching.

Figure 19B:
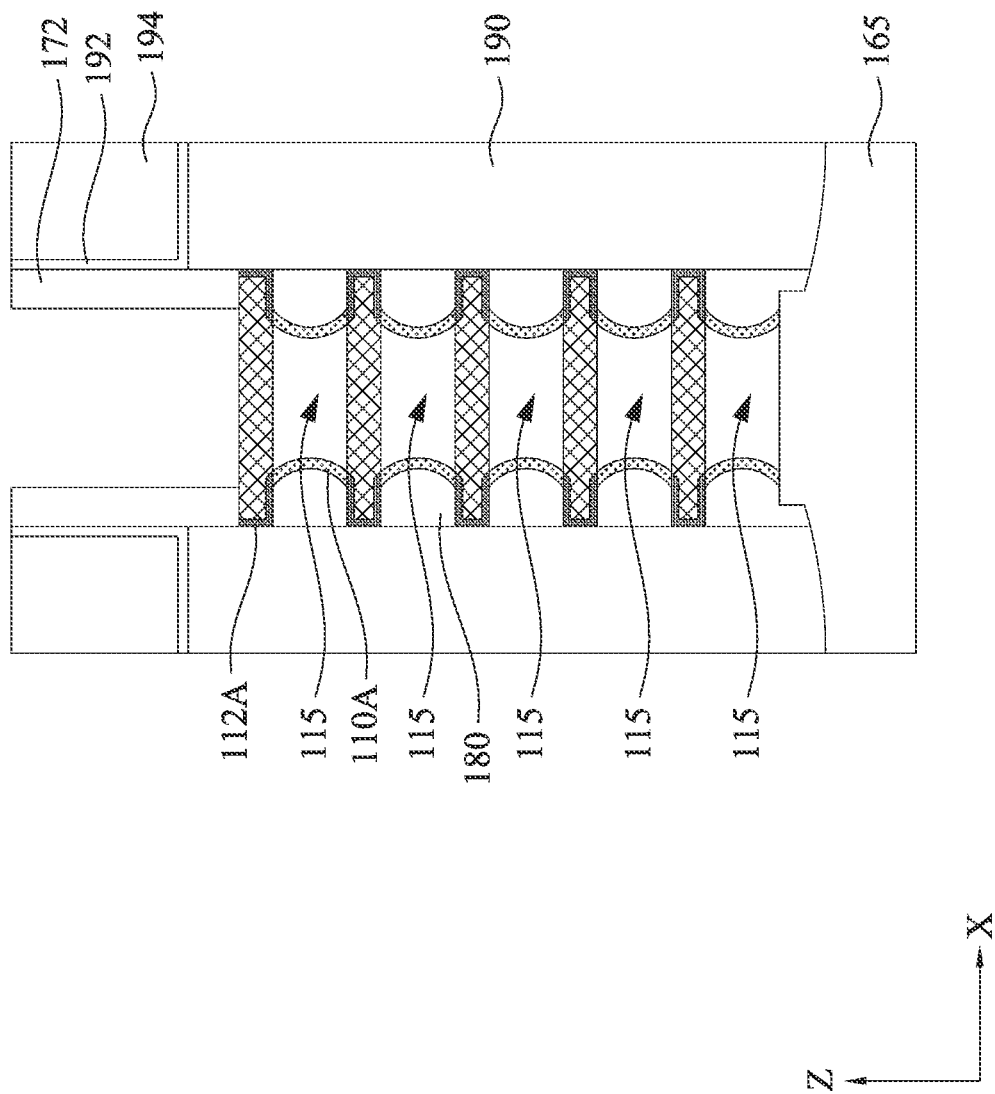
FIG. 19B is the cross sectional view corresponding to line X1-X1 of FIG. 19A.

After the sacrificial gate structures 160 are removed, the first semiconductor layers 110 (as shown in FIG. 15) in the fin structures are removed, as shown in FIGS. 19A and 19B. That is, the first semiconductor layers 110 (see FIG. 18) are etched while the passivation regions 110A of the first semiconductor layers 110 remain on sidewalls of the inner spacers 180 and vertically between the two neighboring second semiconductor layers 112. The passivation regions 110A can be referred to as oxide films. The passivation regions 110A extend along the curved inner sidewalls of the inner spacers 180. As a result, portions of the second semiconductor layers 112 are suspended. The passivation regions 110A have a width (e.g., a horizontal width) less than a width (e.g., a horizontal width) of the inner spacers 180. In the following discussion, the portions of the second semiconductor layers 112 suspended are also referred to as and serve as the channel layers (or nanostructures). The channel layers 112 are slightly etched or not etched. In the present embodiments, the channel layers 112 are slightly etched to form a rectangular-like shape (e.g., a nanostructure). The nanostructures may be nanowires, nanosheets, gate all around (GAA) structure or the like. FIG. 19B is the cross sectional view along the fin structure. Gaps 115 are left between neighboring channel layers 112. The first semiconductor layers 110 can be removed or etched using an etchant that can selectively etch the first semiconductor layers 110 at a faster etching rate than etching the second semiconductor layers 112. The channel layers 112 extend in the X-direction above the substrate 100 and are arranged in the Z direction perpendicular to the X-direction. The curved inner sidewalls of the inner spacers 80 face away from the interface between the S/D epitaxial layers 190 and the inner spacers 180. Each of the passivation regions 110A has a curved surface facing away from the curved inner sidewalls of the inner spacers 180. In some embodiments where the passivation regions 110A are oxide films, the oxide films face away from the curved inner sidewalls.

As discussed above, each of the channel layers 112 (e.g., nanostructures) has passivation regions 112A. In particular, each of the channel layers 112 has outer regions (e.g., the passivation regions 112A) having a composition different from a composition of an inner region of each of the channel layers 112 (e.g., nanostructures). The inner spacers 180 are vertically between two neighboring channel layers 112. For example, the inner spacers 180 are vertically between the passivation regions 112A of each of the channel layers 112. In other words, the passivation regions 112A face the inner spacers 180. Each of the passivation regions 112A has a sidewall portion and a bottom portion connected to the sidewall portion. In some embodiments, at least one of the passivation regions 112A has a top portion, a bottom portion and a sidewall portion connected to the top portion and the bottom portion. The bottom portion of each of the passivation regions 112A is in contact with a top surface of each of the inner spacers 180. One of the channel layers (e.g., nanostructures) 112 has a silicon-to-oxide interface extending between the passivation region 112A and the inner region of the one of the channel layers (e.g., nanostructures) 112, and the silicon-to-oxide interface a C-shaped cross section.

In some embodiments, the first semiconductor layers 110 (also called sacrificial layers to be removed) are SiGe and the second semiconductor layers 112 (also called channel layers to be left in final GAA transistors) are silicon allowing for the selective removal of the first semiconductor layers 110. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 112 may not be significantly etched by the channel release process.

In the present embodiment, since the passivation regions 110A and the inner spacers 180 are made of a material that has etching selectivity to that of the first semiconductor layers 110, the passivation regions 110A and the inner spacers 180 can protect the source/drain epitaxial layers 190 from the etchant used in etching the first semiconductor layers 110.

Figure 20:
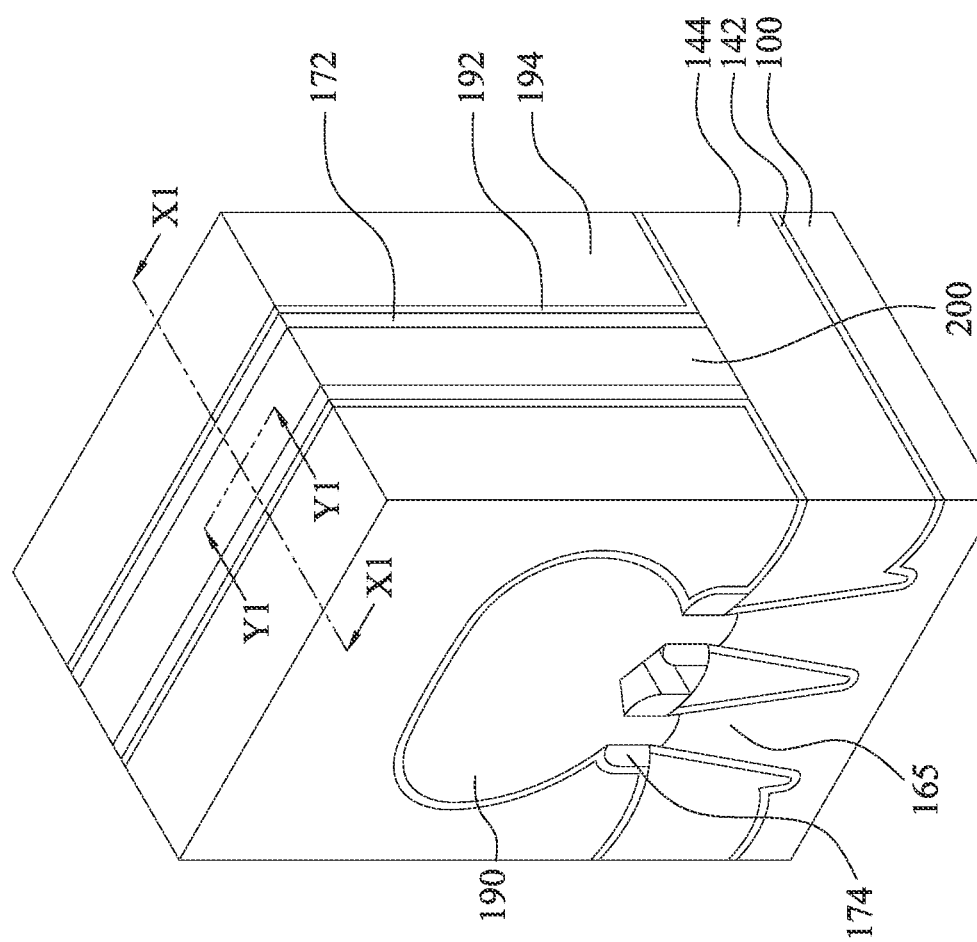
FIG. 20 is a perspective view of the GAA FET device at different stages of fabrication, according to some embodiments of the disclosure.

Referring to FIG. 20, a metal gate structure 200 is formed around each channel layers 112. The metal gate structure 200 extends in a Y direction which is perpendicular to the X direction and the Z direction. The exemplary sequential processes of the formation of the metal gate structure 200 will be discussed in the following figures.

Figure 21A:
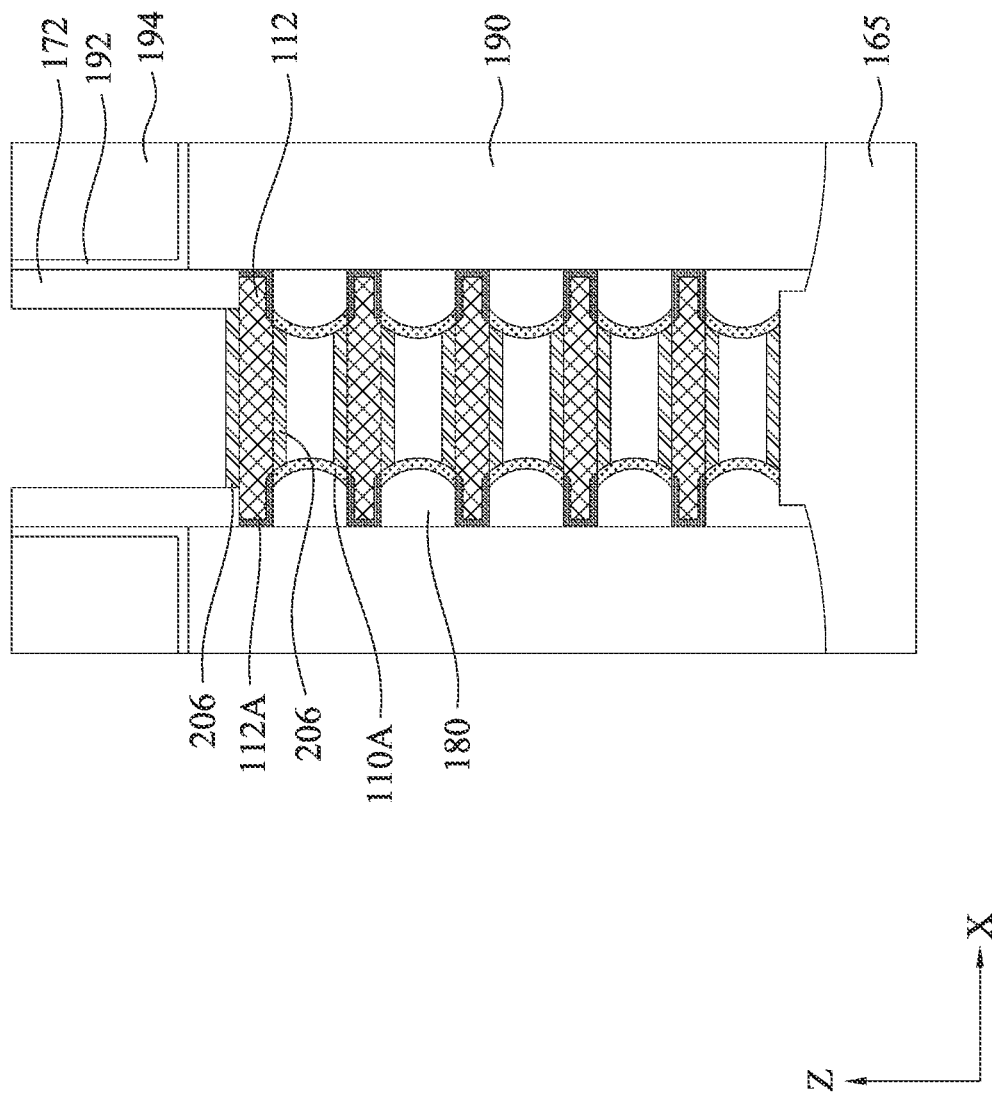
FIGS. 21A, 22A, 23A, 24A and 25A are the cross sectional views corresponding to line X1-X1 of FIG. 20.

FIGS. 21A-25B are various cross-sectional views of a GAA device at different stages of fabrication, according to some embodiments of the disclosure, in which "A" are the cross sectional views corresponding to line X1-X1 of FIG. 20, and "B" are the cross sectional views corresponding to line Y1-Y1 of FIG. 20. FIGS. 21A and 21B follow after FIGS. 19A and 19B.

After the first semiconductor layers 110 are removed, interfacial layers 206 are formed on surface of the channel region, e.g., the surface of the channel layers 112, and on the surface of the recessed fins 165. The interfacial layers 206 are formed of silicon oxide or silicon oxynitride grown by a thermal oxidation process. For example, the interfacial layer 206 can be grown by wet oxidation, a rapid thermal oxidation (RTO) process or by an annealing process using oxygen. In some embodiments where the interfacial layers 206 are formed by oxidation, all exposed semiconductor surfaces may be oxidized, and thus exposed surfaces of the channel layers 112 and the recessed fins 165 are all coated with interfacial layers 206.

Figure 22A:
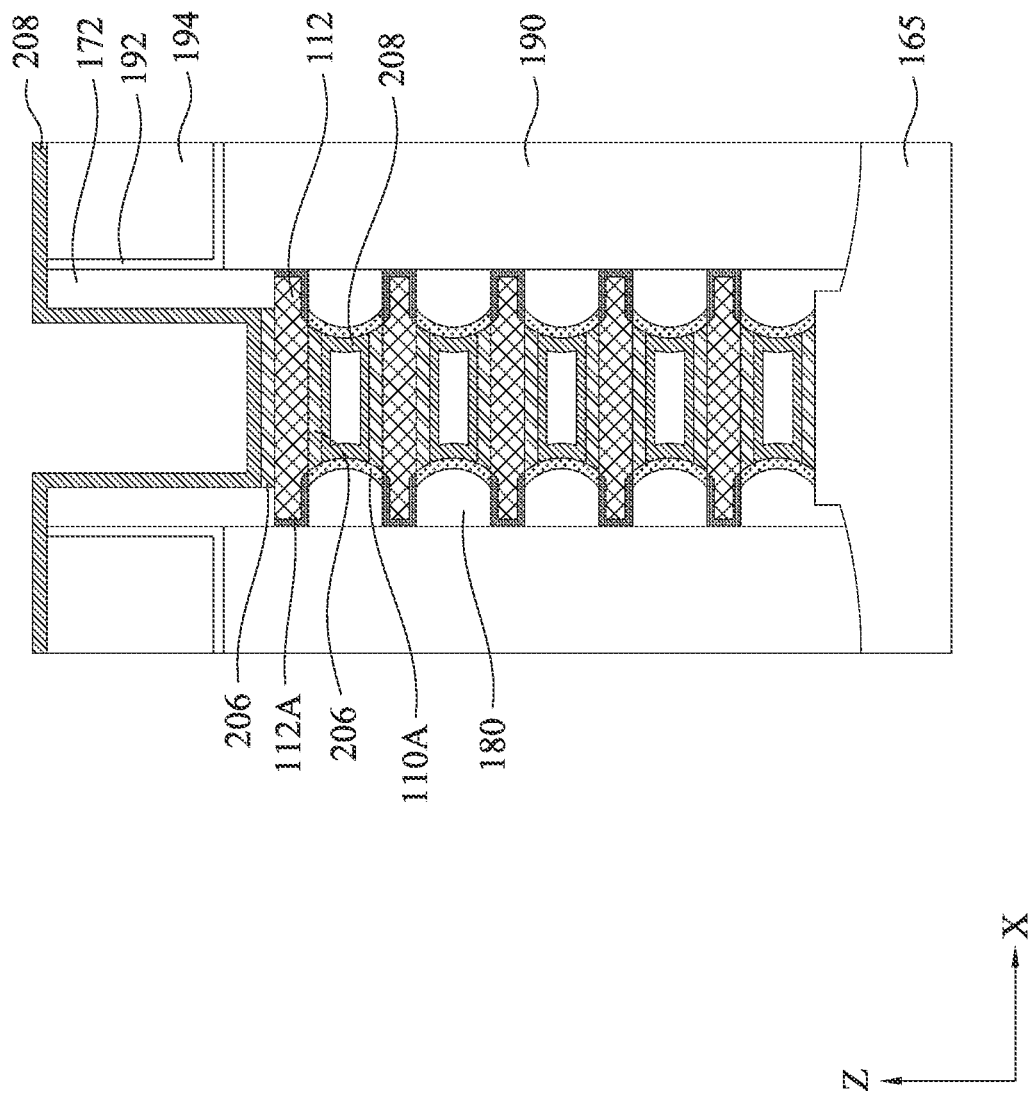

Referring to FIGS. 22A and 22B, after the interfacial layers 206 are formed, a high-k gate dielectric layer 208 is formed along the gate sidewall spacers 172, the surface of the inner spacer 180, the surface of the ILD layer 194 and the interfacial layer 206, by a deposition process. In some embodiments, the high-k gate dielectric layer 208 may include metal oxides. Examples of metal oxides used for high-k gate dielectric layer 208 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k gate dielectric layer 208 may be formed using a suitable process such as atomic layer deposition (ALD), chemical vapor deposition (CVD), physical vapor deposition (PVD) or other suitable method. The passivation regions 110A are between the high-k dielectric layer along each of the inner spacers 180.

Figure 23A:
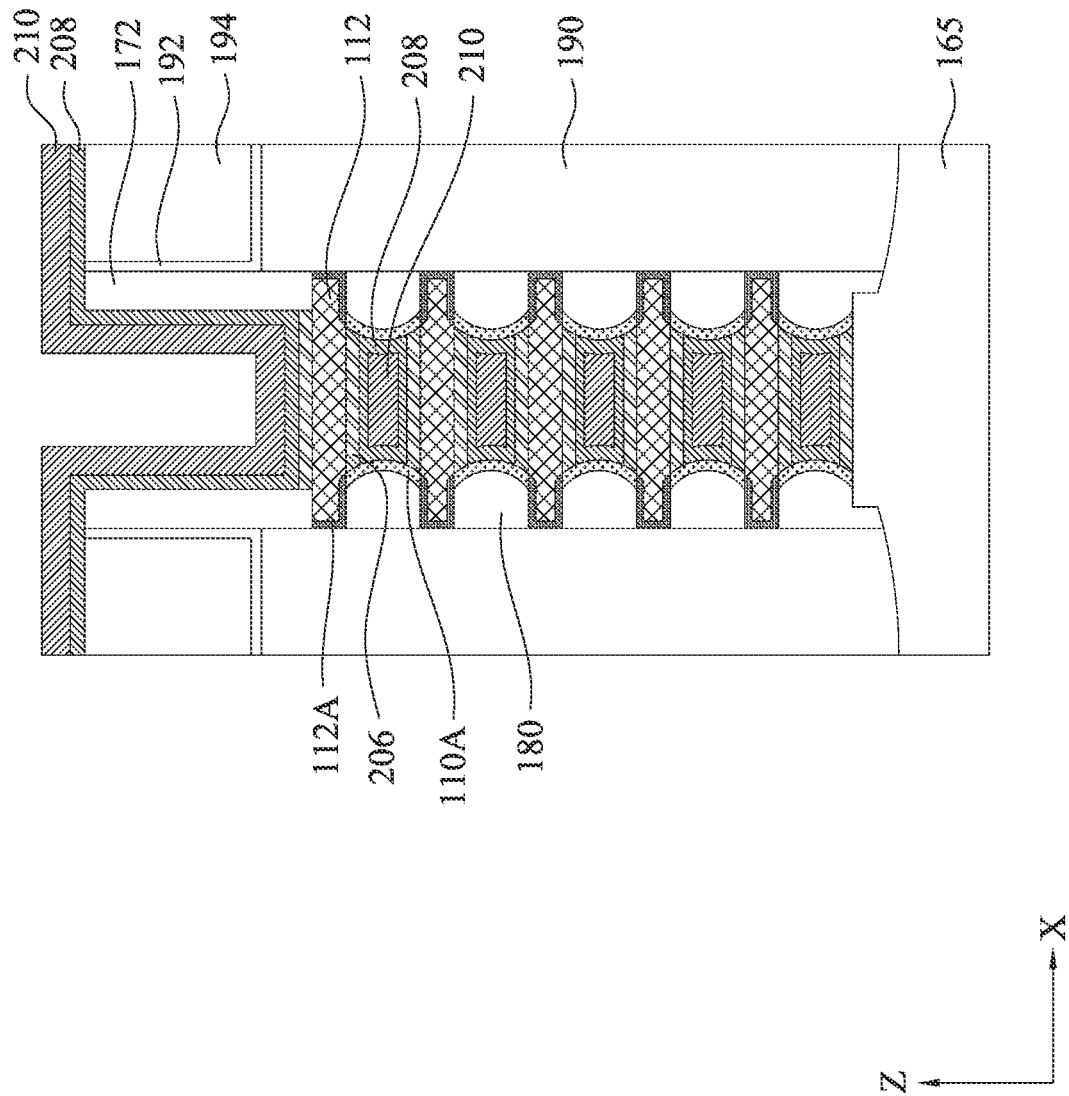
Figure 23B:
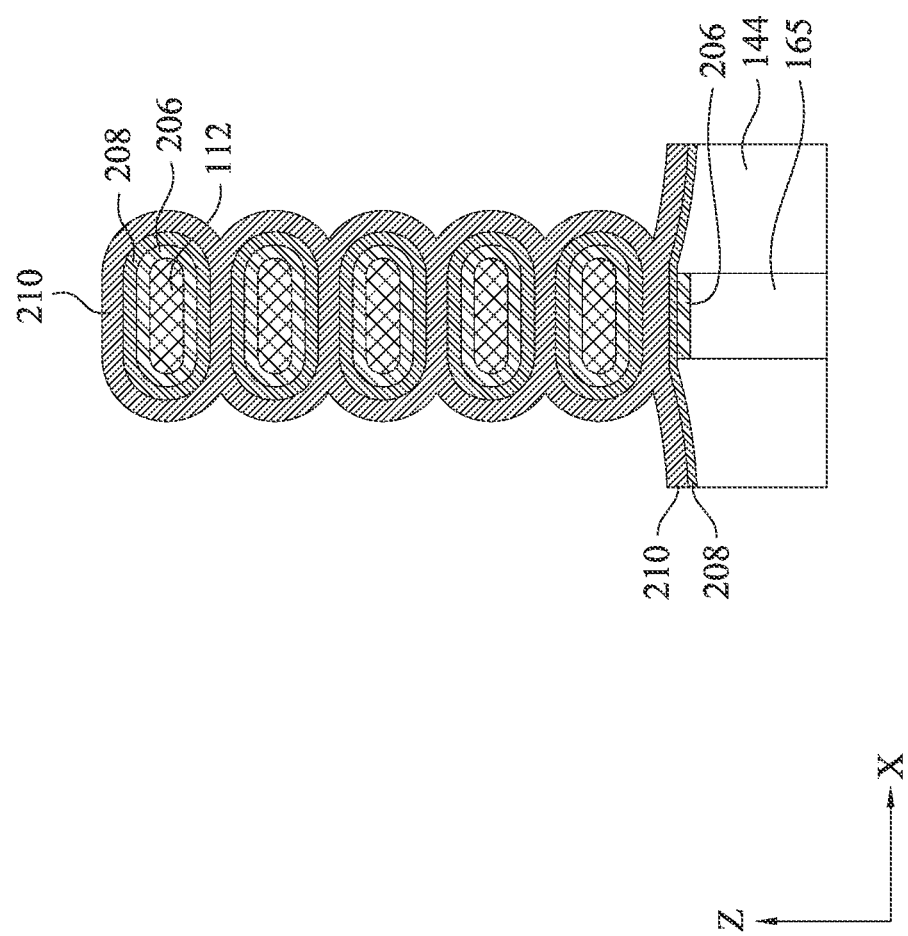

Reference is made to FIGS. 23A and 23B. A work function layer 210 is formed on the high-k gate dielectric layer 208. For example, the work function layer 210 is deposited to surround each of the channel layers (or nanostructures) 112. A portion of the work function layer 210 is formed vertically between adjacent channel layers (or nanostructures) 112 and fills the gap 115 between adjacent channel layers 112. Two of the passivation regions 110A are laterally spaced apart by one of the work function layer 210.

The work function layer 210 may be formed to provide a proper work function for the resulting gate structure. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

The work function layer 210 is a single-layer film or a multi-layer film. In some embodiments where the work function layer 210 is a multi-layer film, the work function layer may be a stack of one or more N-metal layers and one or more P-metal layers.

Figure 24A:
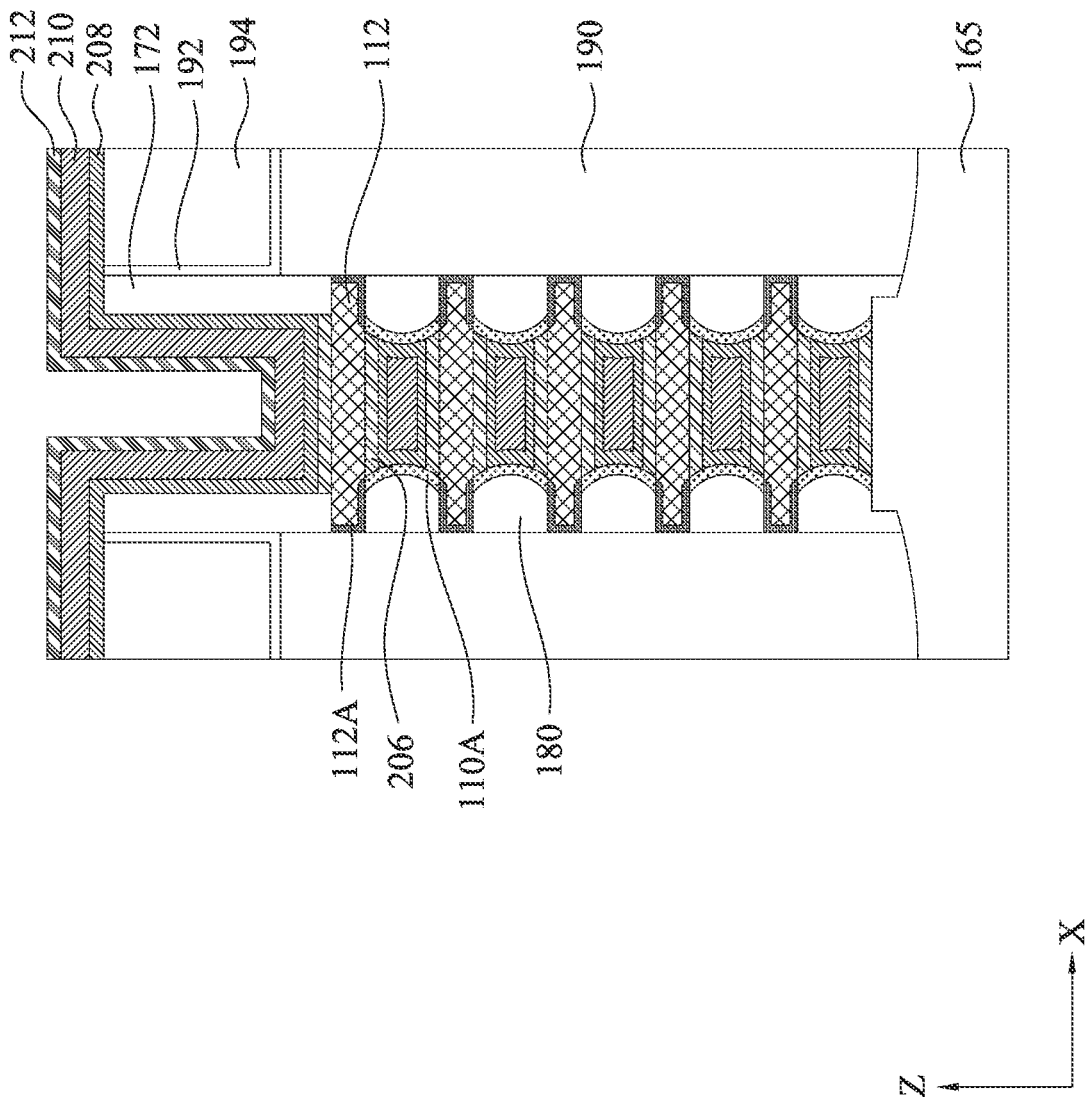
Figure 24B:
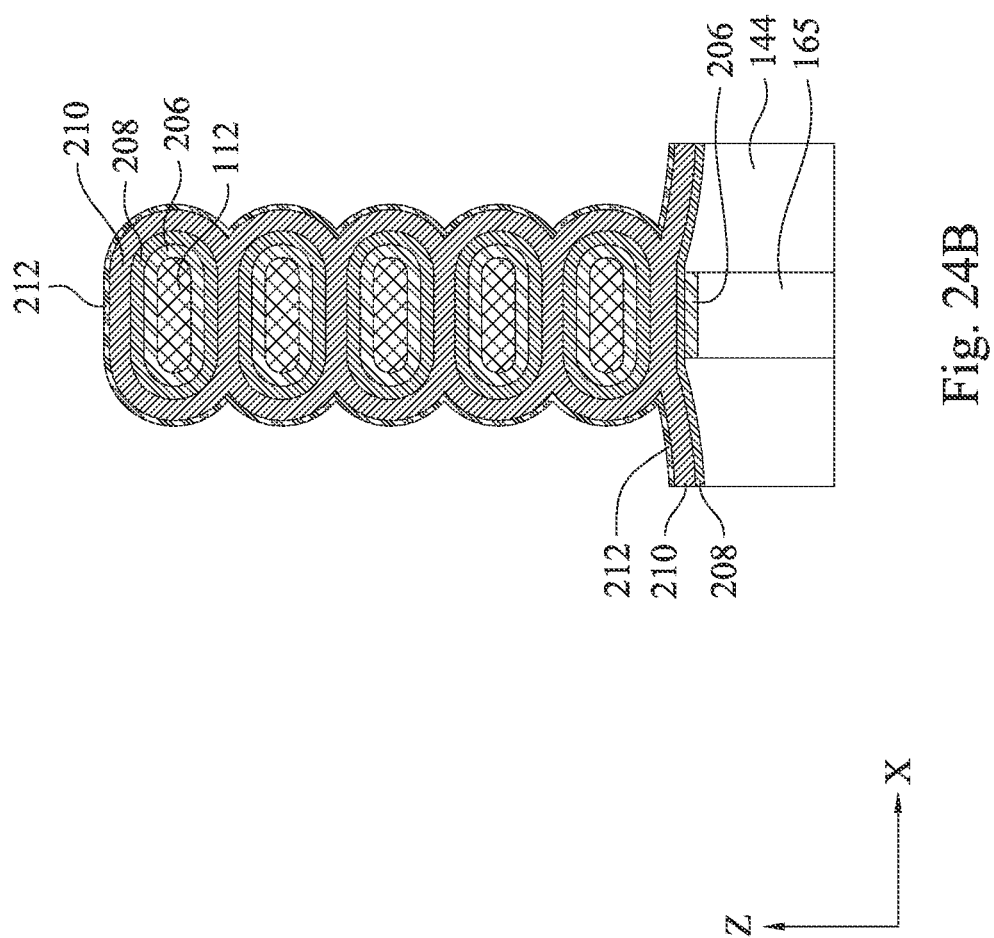

Reference is made to FIGS. 24A and 24B. A glue layer 212 is formed on and surrounds the work function layer 210. The glue layer 212 may be used to increase adhesion between the work function layer 210 and a subsequently formed fill metal layer (see FIGS. 25A and 25B) so as to prevent the fill metal layer from peeling or delaminating. The glue layer 212 is a conformal layer and is conformally formed over the work function layer 210. In some embodiments, the glue layer 212 is a nitride layer. In some embodiments, the glue layer 212 is made of or includes TiN, TaN, TiAlN, TaCN, TaC or TaSiN, other suitable material, or a combination thereof and may be formed by CVD, ALD, PVD and/or other suitable process.

Figure 25A:
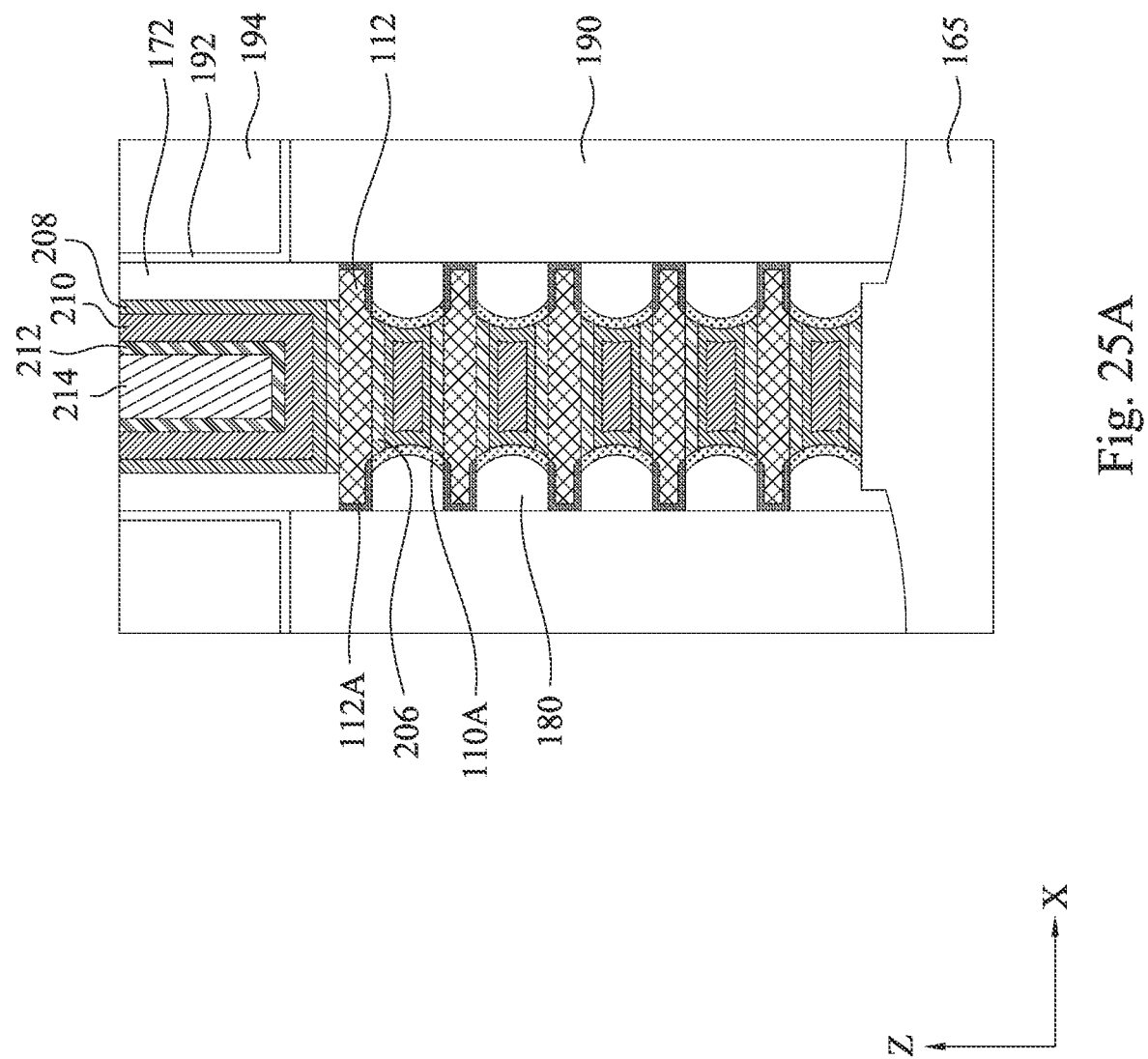
Figure 25B:
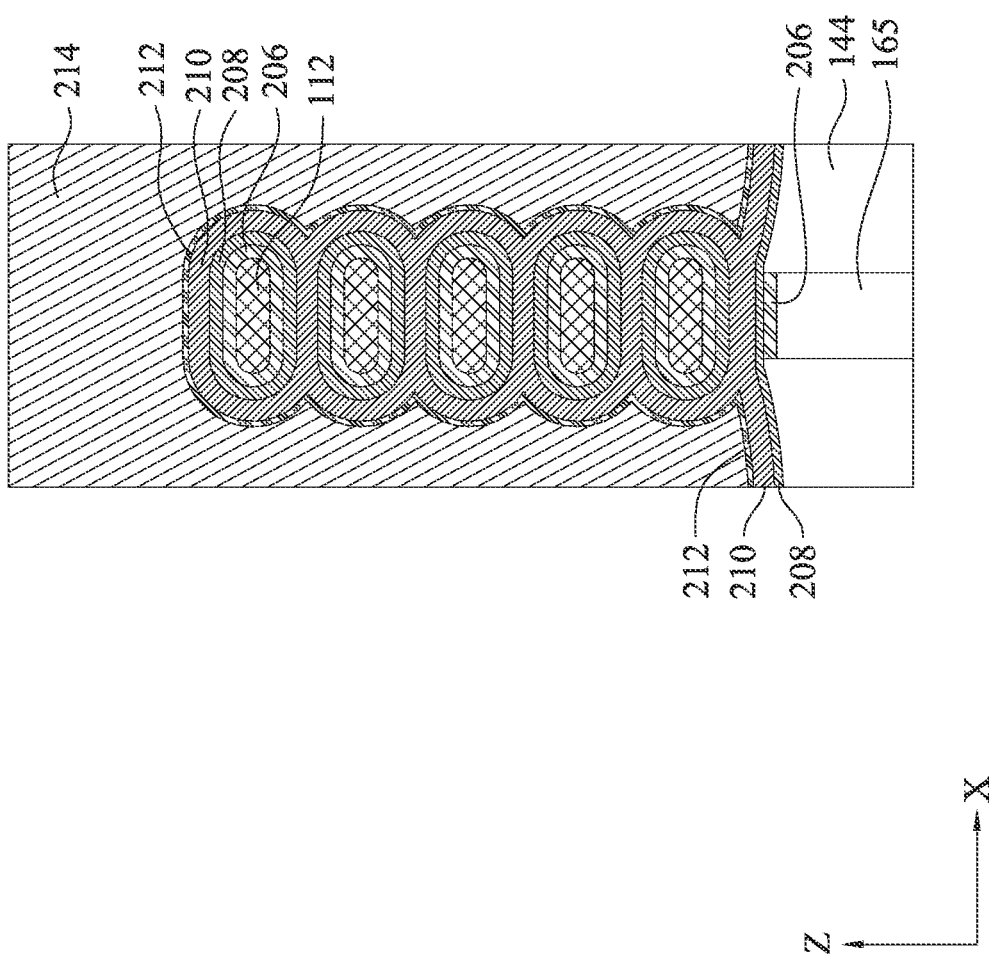

Referring to FIGS. 25A and 25B, a fill metal layer 214 is formed within a trench on the glue layer 212 between the gate sidewall spacers 172. The fill metal layer 214 is deposited over the work function layer 210. The fill metal layer 214 may be a work function layer (i.e., formed of N-metal or P-metal discussed above). In some embodiments, the fill metal layer 214 includes tungsten. In an embodiment, after the interfacial layers 206, the high-k gate dielectric layer 208, the work function layer 210, the glue layer 212 and the fill metal layer 214 are deposited, a CMP process is performed to planarize a top surface of the semiconductor device 10. The passivation regions 110A are symmetric with respect to the metal gate structure 200. The curved inner sidewalls of the inner spacers 180 are convex toward the gate structure 200 (see FIG. 20).

Figure 26:
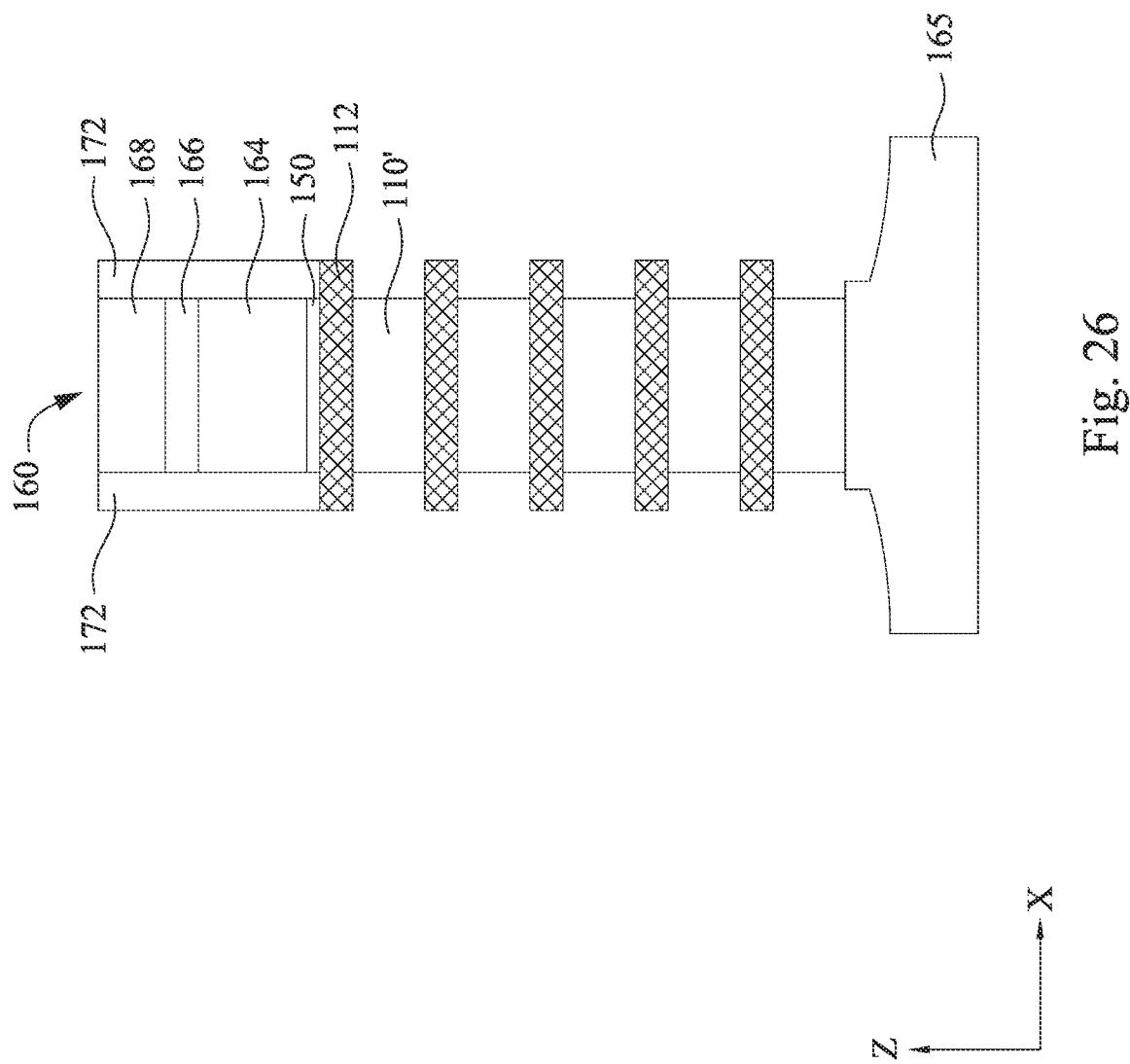
FIGS. 26 and 27 are the cross sectional views corresponding to line X1-X1 of FIG. 20 in accordance with some other embodiments.
Figure 27:
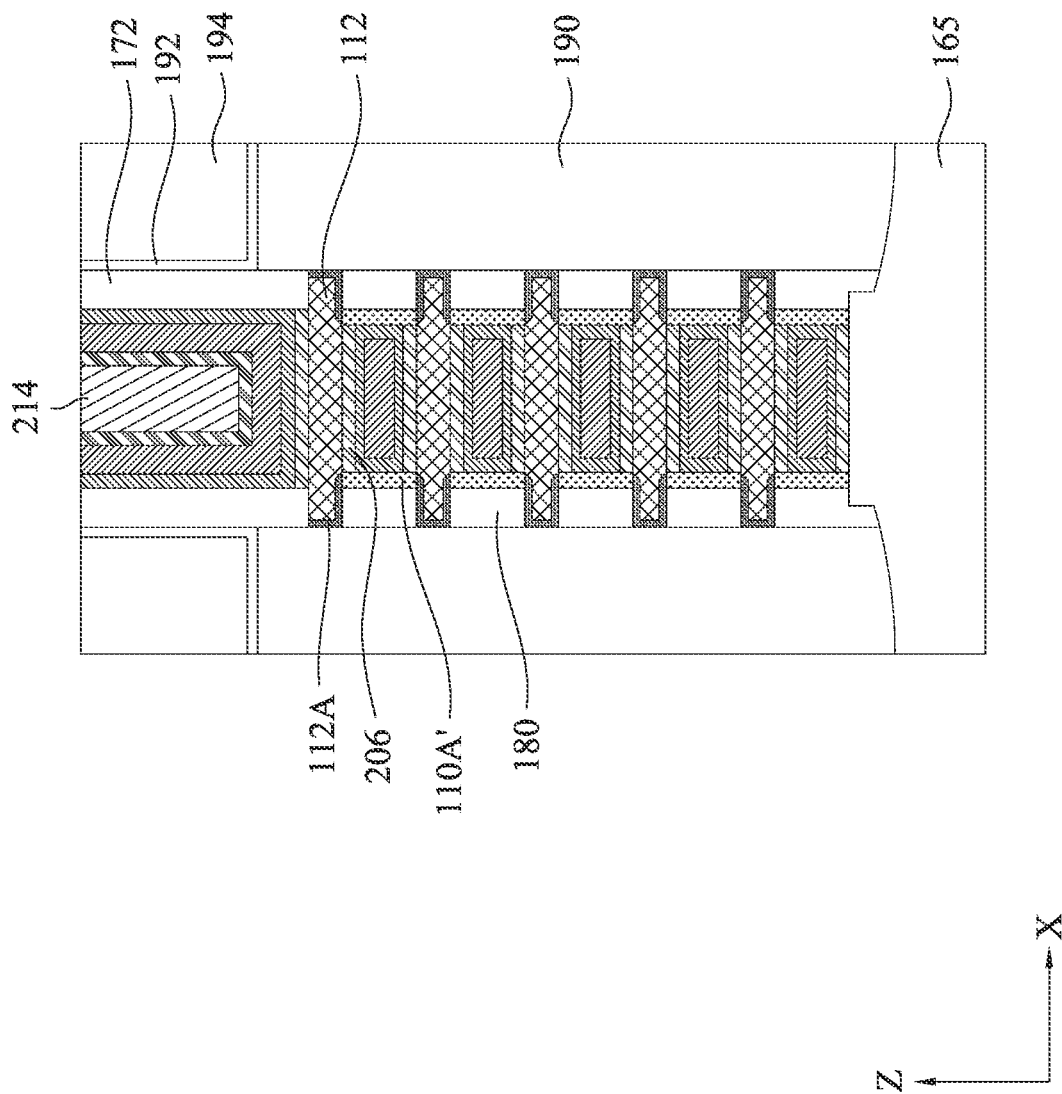

Referring to FIG. 26, in some other embodiments, after recess etching the first semiconductor layers 110', the first semiconductor layers 110' have opposite flat sidewalls. In this case, the passivation regions 110A' have opposite flat surfaces, as shown in FIG. 27. Therefore, the interface between each of the passivation regions 110A' and each of the inner spacers 180 are flat.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a cleaning process using oxygen-containing agent after recess etching the first semiconductor layers can form the passivation regions in the outer regions of the first semiconductor layers and the second semiconductor layers. Such passivation regions can prevent germanium atoms in the first semiconductor layers from diffusing out during forming the inner spacers. Another advantage is that the fix charge density at the interface between the second semiconductor layer and the inner spacer can be tuned by the anneal process. Yet another advantage is that the dopants can be retained such that low resistance of the S/D epitaxial layers can be maintained.

In some embodiments, a semiconductor device includes a plurality of nanostructures extending in a first direction above a semiconductor substrate and arranged in a second direction substantially perpendicular to the first direction and a gate structure extending in a third direction perpendicular to both the first and second directions, the gate structure surrounding each of the plurality of nanostructures. Each of the plurality of nanostructures has an outer region having a composition different from a composition of an inner region of each of the plurality of the nanostructures. The gate structure includes a plurality of high-k gate dielectric layers respectively surrounding the plurality of nanostructures, a work function layer surrounding each of the plurality of high-k gate dielectric layers and a fill metal layer surrounding the work function layer. In some embodiments, the composition of the outer region of each of the nanostructures includes oxide. In some embodiments, the gate structure further includes inner spacers vertically between each of the plurality of the nanostructures and oxide films between each of the inner spacers and each of the plurality of high-k gate dielectric layers. In some embodiments, the oxide films and the outer regions of the nanostructures include silicon oxide. In some embodiments, two of the oxide films are spaced apart by one of the plurality of nanostructures. In some embodiments, the oxide films are symmetric with respect to the gate structure. In some embodiments, one of the outer regions of the nanostructures has an L-shaped cross section. In some embodiments, one of the plurality of nanostructures has a silicon-to-oxide interface extending between the outer region and the inner region of the one of the plurality of nanostructures, and the silicon-to-oxide interface a C-shaped cross section.

In some embodiments, a semiconductor device includes a plurality of nanostructures, a plurality of inner spacers and a gate structure. The plurality of nanostructures extend in a first direction above a semiconductor substrate and are arranged in a second direction substantially perpendicular to the first direction. The plurality of inner spacers are vertically between two of the plurality of nanostructures. The plurality of nanostructures have oxide regions facing the inner spacers. The gate structure extends in a third direction perpendicular to both the first and second directions and surrounds each of the plurality of nanostructures. The gate structure includes a plurality of high-k gate dielectric layers, a work function layer and a fill metal layer. The plurality of high-k gate dielectric layers respectively surrounds the plurality of nanostructures. The work function layer surrounds each of the plurality of high-k gate dielectric layers. The fill metal layer surrounds the work function layer. In some embodiments, the inner spacers and the oxide regions have different compositions. In some embodiments, the oxide regions include silicon oxide and the nanostructures include silicon. In some embodiments, the inner spacers have curved inner sidewalls. In some embodiments, the curved inner sidewalls of the inner spacers are convex toward the gate structure. In some embodiments, the semiconductor device further includes oxide films extending along the curved inner sidewalls of the inner spacers. In some embodiments, the oxide films are conformal to the curved inner sidewalls. In some embodiments, the oxide films have a width less than a width of the inner spacers.

In some embodiments, a method of forming a semiconductor device includes forming a fin structure having a stack of alternating first semiconductor layers and second semiconductor layers over a substrate, the first semiconductor layers and the second semiconductor layers having different compositions, forming a dummy gate structure across the fin structure, forming gate spacers on opposite sidewalls of the dummy gate structure, respectively, removing the dummy gate structure to form a gate trench between the gate spacers, horizontally recessing the first semiconductor layers, after recessing the first semiconductor layers, performing a cleaning process using an oxygen-containing agent, after the cleaning process, forming inner spacers on opposite sides of the recessed first semiconductor layers, after forming the inner spacers, removing the first semiconductor layers in the gate trench, such that the second semiconductor layers are suspended in the gate trench to serve as nanostructures, forming a work function layer surrounding each of the nanostructures, and depositing a fill metal layer over the work function layer. In some embodiments, the cleaning process is performed such that outer regions of the first semiconductor layers are oxidized. In some embodiments, the cleaning process is performed such that outer regions of the second semiconductor layers are oxidized. In some embodiments, the method further includes annealing the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of nanostructures extending in a first direction above a semiconductor substrate and arranged in a second direction substantially perpendicular to the first direction, wherein each of the plurality of nanostructures has an outer region having a composition different from a composition of an inner region of each of the plurality of the nanostructures, and the composition of the outer region of each of the nanostructures includes oxide; and
a gate structure extending in a third direction perpendicular to both the first and second directions, the gate structure surrounding each of the plurality of nano structures, wherein the gate structure comprises:
a plurality of high-k gate dielectric layers respectively surrounding the plurality of nano structures;
a work function layer surrounding each of the plurality of high-k gate dielectric layers; and
a fill metal layer surrounding the work function layer.

2. The semiconductor device of claim 1, wherein the gate structure further comprises:
inner spacers vertically between each of the plurality of the nano structures; and
oxide films between each of the inner spacers and each of the plurality of high-k gate dielectric layers.

3. The semiconductor device of claim 2, wherein the oxide films and the outer regions of the nanostructures include silicon oxide.

4. The semiconductor device of claim 2, wherein two of the oxide films are spaced apart by one of the plurality of nanostructures.

5. The semiconductor device of claim 2, wherein the oxide films are symmetric with respect to the gate structure.

6. The semiconductor device of claim 1, wherein one of the outer regions of the nanostructures has an L-shaped cross section.

7. The semiconductor device of claim 1, wherein one of the plurality of nanostructures has a silicon-to-oxide interface extending between the outer region and the inner region of the one of the plurality of nanostructures, and the silicon-to-oxide interface a C-shaped cross section.

8. A semiconductor device, comprising:
a plurality of nanostructures extending in a first direction above a semiconductor substrate and arranged in a second direction substantially perpendicular to the first direction;
a plurality of inner spacers vertically between two of the plurality of nanostructures, wherein the plurality of nanostructures have oxide regions facing the inner spacers; and
a gate structure extending in a third direction perpendicular to both the first and second directions, the gate structure surrounding each of the plurality of nanostructures, wherein the gate structure comprises:
a plurality of high-k gate dielectric layers respectively surrounding the plurality of nanostructures;
a work function layer surrounding each of the plurality of high-k gate dielectric layers; and
a fill metal layer surrounding the work function layer.

9. The semiconductor device of claim 8, wherein the inner spacers and the oxide regions have different compositions.

10. The semiconductor device of claim 8, wherein the oxide regions include silicon oxide and the nanostructures include silicon.

11. The semiconductor device of claim 8, wherein the inner spacers have curved inner sidewalls.

12. The semiconductor device of claim 11, wherein the curved inner sidewalls of the inner spacers are convex toward the gate structure.

13. The semiconductor device of claim 11, further comprising:
oxide films extending along the curved inner sidewalls of the inner spacers.

14. The semiconductor device of claim 13, wherein the oxide films are conformal to the curved inner sidewalls.

15. The semiconductor device of claim 14, wherein the oxide films have a width less than a width of the inner spacers.

16. A method of forming a semiconductor device, comprising:
forming a fin structure having a stack of alternating first semiconductor layers and second semiconductor layers over a substrate, the first semiconductor layers and the second semiconductor layers having different compositions;
forming a dummy gate structure across the fin structure;
forming gate spacers on opposite sidewalls of the dummy gate structure, respectively;
removing the dummy gate structure to form a gate trench between the gate spacers;
horizontally recessing the first semiconductor layers;
after recessing the first semiconductor layers, performing a cleaning process using an oxygen-containing agent;
after the cleaning process, forming inner spacers on opposite sides of the recessed first semiconductor layers;
after forming the inner spacers, removing the first semiconductor layers in the gate trench, such that the second semiconductor layers are suspended in the gate trench to serve as nanostructures;
forming a work function layer surrounding each of the nanostructures; and
depositing a fill metal layer over the work function layer.

17. The method of claim 16, wherein the cleaning process is performed such that outer regions of the first semiconductor layers are oxidized.

18. The method of claim 16, wherein the cleaning process is performed such that outer regions of the second semiconductor layers are oxidized.

19. The method of claim 16, further comprising:
annealing the inner spacers.

20. The semiconductor device of claim 1, wherein the oxide of the composition of the outer region of each of the nanostructures includes silicon germanium oxide, silicon oxide, germanium oxide or a combination thereof.

\* \* \* \* \*